United States Patent
Chung et al.

(10) Patent No.: US 12,074,035 B2
(45) Date of Patent: Aug. 27, 2024

(54) METHOD FOR PARTIALLY REMOVING TUNGSTEN IN SEMICONDUCTOR MANUFACTURING PROCESS

(71) Applicant: TAIWAN SEMICONDUCTOR MANUFACTURING COMPANY, LTD., Hsinchu (TW)

(72) Inventors: Chia-Ling Chung, Hsinchu (TW); Chun-Chih Cheng, Hsinchu (TW); Ying-Liang Chuang, Hsinchu (TW); Ming-Hsi Yeh, Hsinchu (TW); Kuo-Bin Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 218 days.

(21) Appl. No.: 17/742,806

(22) Filed: May 12, 2022

(65) Prior Publication Data
US 2023/0369063 A1 Nov. 16, 2023

(51) Int. Cl.
*H01L 21/3213* (2006.01)
*H01L 29/40* (2006.01)

(52) U.S. Cl.
CPC ...... *H01L 21/32134* (2013.01); *H01L 29/401* (2013.01)

(58) Field of Classification Search
None
See application file for complete search history.

(56) References Cited

U.S. PATENT DOCUMENTS

| | | | |
|---|---|---|---|
| 2003/0003754 A1* | 1/2003 | Yokoi | H01L 21/28123 257/E21.309 |
| 2005/0133067 A1* | 6/2005 | Bergman | H01L 21/67051 257/E21.228 |
| 2005/0217707 A1* | 10/2005 | Aegerter | H01L 21/67051 257/E21.309 |
| 2014/0134842 A1* | 5/2014 | Zhang | H01L 21/31116 438/694 |
| 2014/0154889 A1* | 6/2014 | Wang | H01L 21/3065 438/720 |
| 2020/0312673 A1* | 10/2020 | Tsai | H01L 21/32136 |
| 2023/0360969 A1* | 11/2023 | Chung | H01L 21/76846 |

\* cited by examiner

*Primary Examiner* — Allan W. Olsen
(74) *Attorney, Agent, or Firm* — Birch, Stewart, Kolasch & Birch, LLP

(57) ABSTRACT

A method for selectively removing a tungsten-including layer includes: forming a tungsten-including layer which has a first portion and a second portion; performing a treatment on a surface region of the first portion of the tungsten-including layer so as to convert tungsten in the surface region into tungsten oxide; and partially removing the tungsten-including layer using an etchant which has a higher etching selectivity to tungsten than tungsten oxide such that the second portion of the tungsten-including layer is fully removed, and the first portion of the tungsten-including layer, having the tungsten oxide in the surface region, is at least partially retained.

20 Claims, 32 Drawing Sheets

METHOD FOR PARTIALLY REMOVING TUNGSTEN IN SEMICONDUCTOR MANUFACTURING PROCESS

BACKGROUND

The semiconductor integrated circuit (IC) industry has, over the decades, experienced tremendous advancements and is still undergoing vigorous development. Along with increasing demands on more advanced semiconductor devices, manufacturing processes thereof also encounter a lot of challenges. To overcome such challenges, the industry thus has put much effort in developing different techniques applicable to methods for manufacturing semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
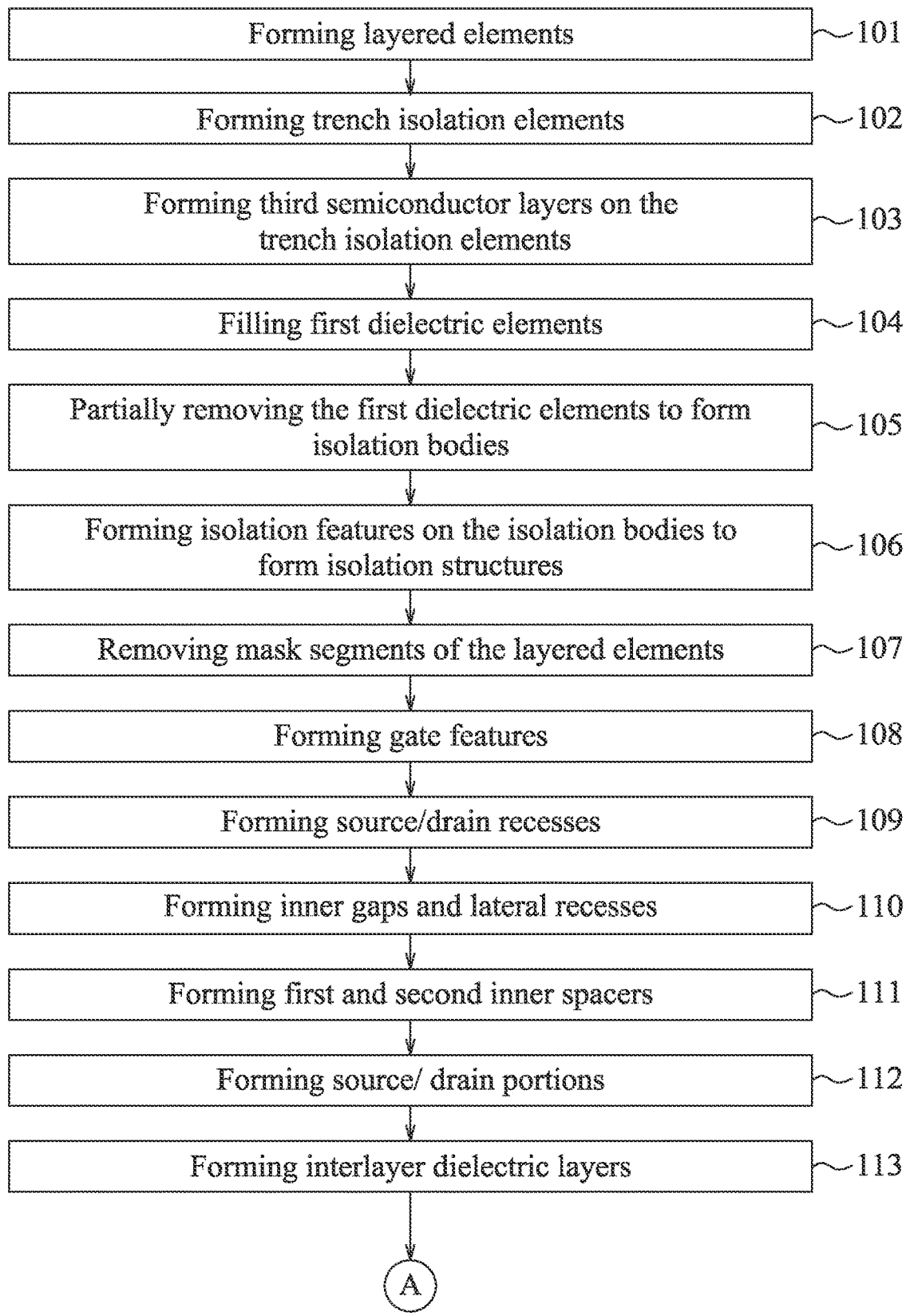
FIG. 1A is a flow diagram of a method for making a device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "below," "upper," "lower," "uppermost," "lowermost," "inner," "outer," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
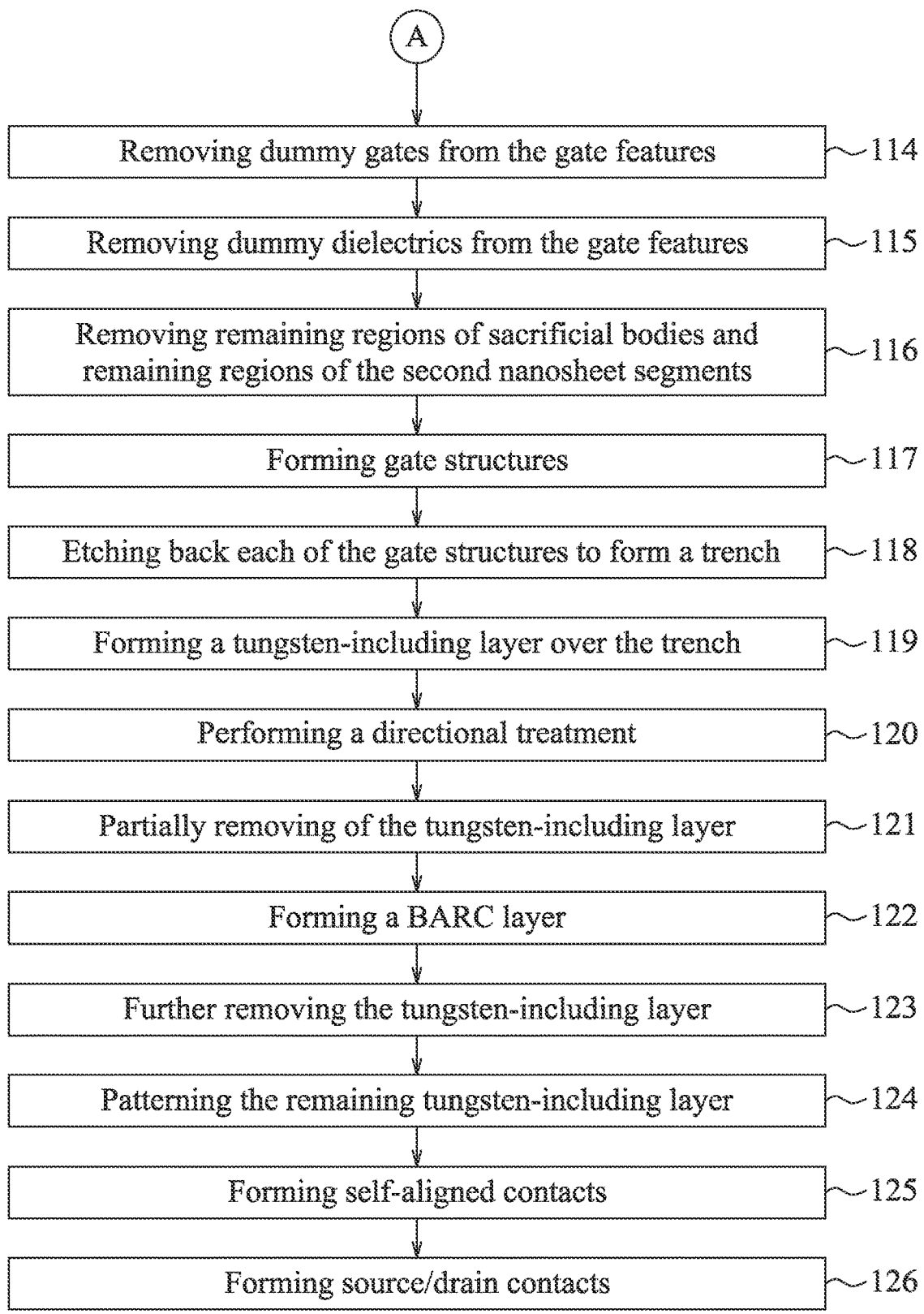
FIG. 1B is a continuation of the flow diagram of the method shown in FIG. 1A.

The present disclosure is directed to a method for manufacturing a device, in which a tungsten-including layer is partially removed. The device may be, for example, but not limited to, a memory device, a multi-gate device, or other suitable devices. FIGS. 1A and 1B are flow diagrams illustrating a method for manufacturing the device in accordance with some embodiments. FIGS. 2A to 22B, and 24A to 28 illustrate schematic views of intermediate stages of the method. Some repeating structures are omitted in FIGS. 2A to 22B, and 24A to 28 for the sake of brevity. Additional steps can be provided before, after or during the method, and some of the steps described herein may be replaced by other steps or be eliminated. In the exemplary method according to the present disclosure, the device is a multi-gate device.

Figure 2B:
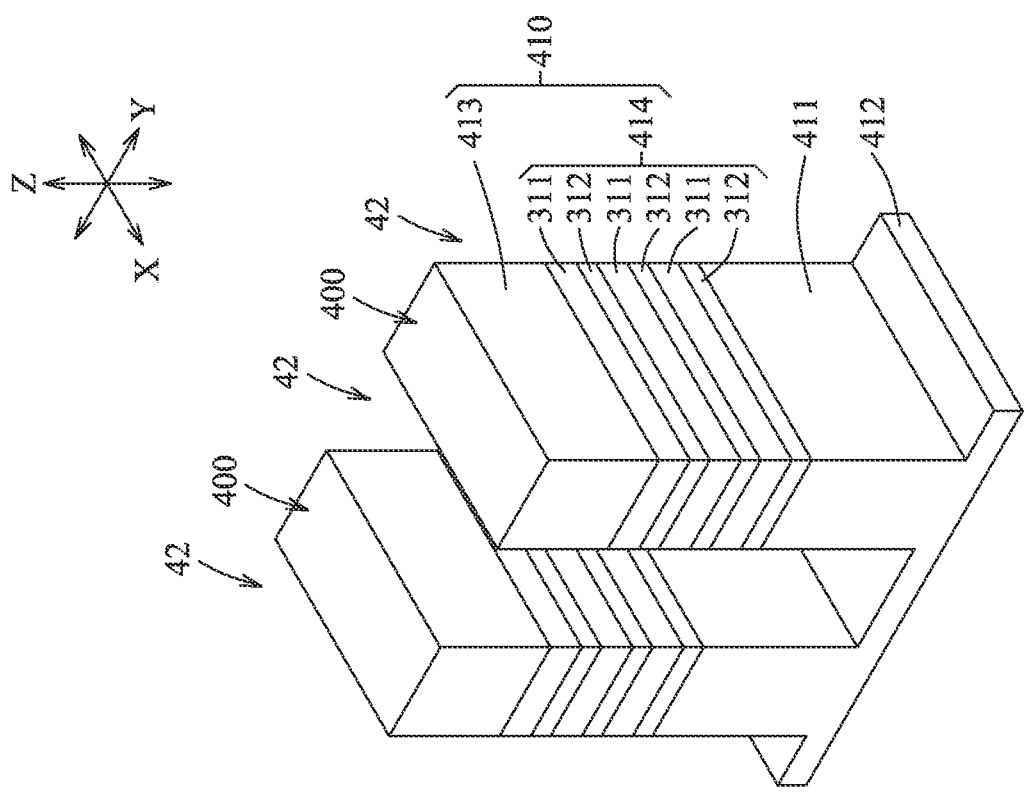
FIGS. 2A to 22B, and 24A to 28 are schematic views illustrating intermediate stages of the method in accordance with some embodiments of the present disclosure.
Figure 2A:
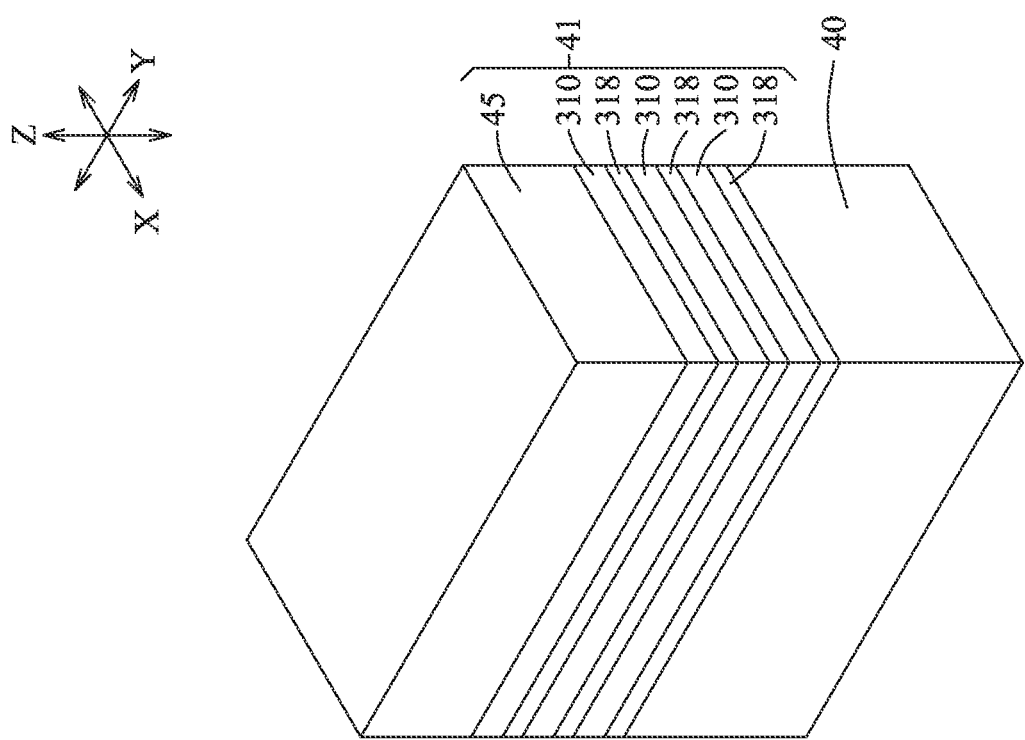

Referring to FIG. 1A and the examples illustrated in FIGS. 2A and 2B, the method begins at step 101, where a layered element 400 is formed. In this embodiment, as shown in FIG. 2B, two of the layered elements 400 are formed by patterning a stack of semiconductor layers 41 (hereinafter referred to as the stack 41) disposed on a substrate 40 and etching back the substrate 40. The substrate 40 and the stack 41 are shown in FIG. 2A.

The stack 41 has at least one first semiconductor layer 310 including a first semiconductor material, and at least one second semiconductor layer 318 disposed to alternate with the first semiconductor layer 310 and including a second semiconductor material. An uppermost one of the at least one first semiconductor layer 310 is disposed over an uppermost one of the at least one second semiconductor layer 318 such that an uppermost one of semiconductor layers in the stack 41 is the uppermost one of the at least one of the first semiconductor layer 310. In some embodiments, a lowermost one of the at least one second semiconductor layer 318 is disposed below a lowermost one of the at least one first semiconductor layer 310 such that a lowermost one of semiconductor layers in the stack 41 is the lowermost one of the at least one of the second semiconductor layer 318. The first and second semiconductor materials have different etch selectivity and/or oxidation rates. In some embodiments, the first semiconductor material may be the same material as that of the substrate 40. The first semiconductor layer 310 and the second semiconductor layer 318 may be intrinsic or doped with a p-type dopant or an n-type dopant. In some embodiments, the first semiconductor material is silicon, and the second semiconductor material is silicon germanium (SiGe). Other materials suitable for the first semiconductor layer 310 and the second semiconductor layer 318 are within the contemplated scope of the present disclosure. In some embodiments, the stack 41 has a plurality of the first semiconductor layers 310 and a plurality of the second semiconductor layers 318. The numbers of the first and second semiconductor layers 310, 318 in the stack 41 are determined according to application requirements. In FIG. 2A, the stack 41 has three first semiconductor layers 310 and three second semiconductor layers 318. The first and second semiconductor layers 310, 318 may have the same thickness or different thicknesses in a Z direction. In FIG. 2A, the thickness of the first semiconductor layer 310 is substantially the same as the thickness of the second semiconductor layer 318.

In some embodiments, the substrate 40 may be, for example, but not limited to, a silicon-on-insulator (SOI) substrate, a germanium-on-insulator (GOI) substrate, a bulk semiconductor substrate, or the like. The substrate 40 may have multiple layers. The substrate 40 may include, for example, elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. The substrate 40 may be intrinsic or doped with a dopant or different dopants. Other materials suitable for the substrate 40 are within the contemplated scope of the present disclosure. In some embodiments, the substrate 40 is a bulk silicon substrate.

Each of the first semiconductor layers 310 and the second semiconductor layers 318 in the stack 41 may be formed on the substrate 40 by a suitable fabrication technique, for example, chemical vapor deposition (CVD), metalorganic CVD (MOCVD), plasma-enhanced CVD (PECVD), molecular-beam epitaxy (MBE), vapor-phase epitaxy (VPE), low-pressure CVD (LPCVD), ultra-high vacuum CVD (UHV-CVD), physical vapor deposition (PVD), atomic layer deposition (ALD), remote plasma atomic layer deposition (RPALD), plasma-enhanced atomic layer deposition (PEALD), molecular-beam deposition (MBD), or the like, or combinations thereof. Other suitable techniques for forming the first semiconductor layers 310 and the second semiconductor layers 318 are within the contemplated scope of the present disclosure.

In some embodiments, the stack 41 further has a mask layer 45 disposed on the uppermost one of the first semiconductor layers 310 (as shown in FIG. 2A). The mask layer 45 may include, for example, but not limited to, a dielectric material, such as a nitride (e.g., SiN), an oxide (e.g., $SiO_x$), or the like, or combinations thereof. Other materials suitable for the mask layer 45 are within the contemplated scope of the present disclosure. The mask layer 45 may have multiple sub-layers. In certain embodiments, the mask layer 45 is a patterned mask layer.

In FIG. 2B, the stack 41 and the substrate 40 are patterned to form the layered elements 400 by removing portions of the stack 41 and the substrate 40. After performing patterning of the stack 41 in step 101, trenches 42 are formed to separate the layered elements 400. Each of the layered elements 400 includes a stack segment 410 formed from patterning of the stack 41, and a substrate segment 411 formed from patterning of the substrate 40. A remaining portion of the substrate 40 that is not patterned forms a residual substrate segment 412. In certain embodiments, the stack segment 410 includes a nanosheet stack 414 which includes at least one first nanosheet 311 and at least one second nanosheet 312 alternating with the at least one first nanosheet 311. In some embodiments, the nanosheet stack 414 includes a plurality of the first nanosheets 311 and a plurality of the second nanosheets 312. The first nanosheets 311 are formed from patterning of the first semiconductor layers 310 in the stack 41, and the second nanosheets 312 are formed from patterning of the second semiconductor layers 318 in the stack 41. In some embodiments, the stack segment 410 further includes a mask segment 413 which is formed on the nanosheet stack 414 and which is formed from patterning of the mask layer 45 in the stack 41. In certain embodiments, each of the layered elements 400 is a fin structure. The patterning of the stack 41 and the substrate 40 may be performed using any suitable etching process, for example, but not limited to, dry etching, wet etching, reactive ion etching (RIE), or the like, or combinations thereof. The etching process may be an anisotropic etching process. In some embodiments, the etching process may use an etch gas such as a nitrogen-containing etch gas (e.g., $NH_3$), a halogen-containing etch gas (for example, a chlorine-containing etch gas such as $Cl_2$, $SiCl_4$, $BCl_3$, $CHCl_3$, $CCl_4$, or the like, a fluorine-containing etch gas such as $F_2$, $NF_3$, $C_xF_y$, $CH_xF_y$, HF, $SF_6$, or the like), a hydrogen-containing etch gas (e.g., $H_2$), or the like, or combinations thereof, but not limited thereto. The etching process may use a carrier gas to deliver the etch gas. The etching process may use a solution containing a wet etchant (i.e., a wet etchant solution). The wet etchant solution may include $NH_4OH$, $H_2SO_4$, $H_2O_2$, HCl, $H_2O$, HF, $HNO_3$, diluted HF, $O_3$, $H_3PO_4$, or the like, or combinations thereof. In certain embodiments, the etching process may be a timed process so that etching is stopped after a period of time when desired portions of the stack 41 and/or the substrate 40 is removed. Before the etching process, a photoresist may be developed using a lithography process which may include the following sub-steps: (i) forming a photoresist (not shown) to cover the stack 41, and (ii) patterning the photoresist such that the photoresist forms into a patterned photoresist. The photoresist may be formed by spin coating. Patterning of the photoresist may be performed using a photomask or without a mask (e.g., ion-beam writing). The etching process uses the patterned photoresist as an etch mask to pattern the stack 41 and the substrate 40. After the etching process, the patterned photoresist is removed by, for example, a stripping process. Other suitable processes for removing the patterned photoresist are within the contemplated scope of the present disclosure. Patterning of the stack 41 and the substrate 40 may include multiple etching processes so that the layered elements 400 are formed according to application requirements. Other suitable processes for patterning the stack 41 and the substrate 40 are within the contemplated scope of the present disclosure.

In some embodiments, a dielectric liner (not shown) may be formed over the structure shown in FIG. 2B using CVD, PVD, ALD, or other suitable processes to enhance the performance of the device obtained using the method according to the disclosure. The dielectric liner includes silicon oxide, silicon nitride, or a combination thereof. Other suitable processes and materials for forming the dielectric liner are within the contemplated scope of the present disclosure.

Figure 3:
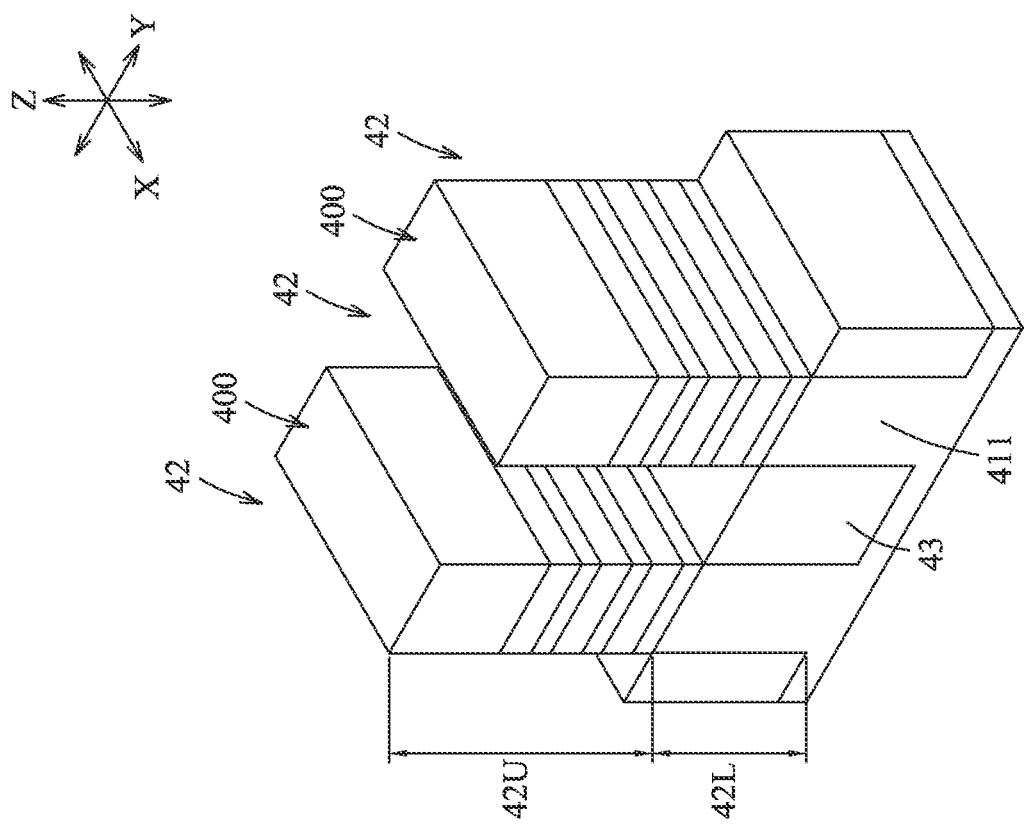

Referring to FIG. 1A and the example illustrated in FIG. 3, the method proceeds to step 102, where trench isolation elements 43 are formed to respectively fill lower portions 42L of the trenches 42. To form the trench isolation elements 43, first, a first isolation material is filled in the trenches 42 by, for example, a deposition process, such as CVD, PECVD, FCVD (flowable CVD), or other suitable techniques. Thereafter, the first isolation material is planarized to remove an excess thereof such that the first isolation material is flush with upper surfaces of the layered elements 400. The planarization process may be a chemical-mechanical planarization (CMP) process, other suitable techniques, or combinations thereof. Then, the first isolation material is etched back using, for example, a dry etching process, but is not limited thereto, so as to obtain the trench isolation elements 43. In FIG. 3, upper surfaces of the trench isolation elements 43 are located at substantially the same level as the upper surfaces of the substrate segments 411 of the layered elements 400. The trench isolation elements 43 may serve as shallow trench isolations (STI) to alternate with the layered elements 400. The trench isolation elements 43 may include an oxide material, such as silicon oxide, but is not limited thereto. Other materials and processes suitable for forming the trench isolation elements 43 are within the contemplated scope of the present disclosure.

Figure 4:
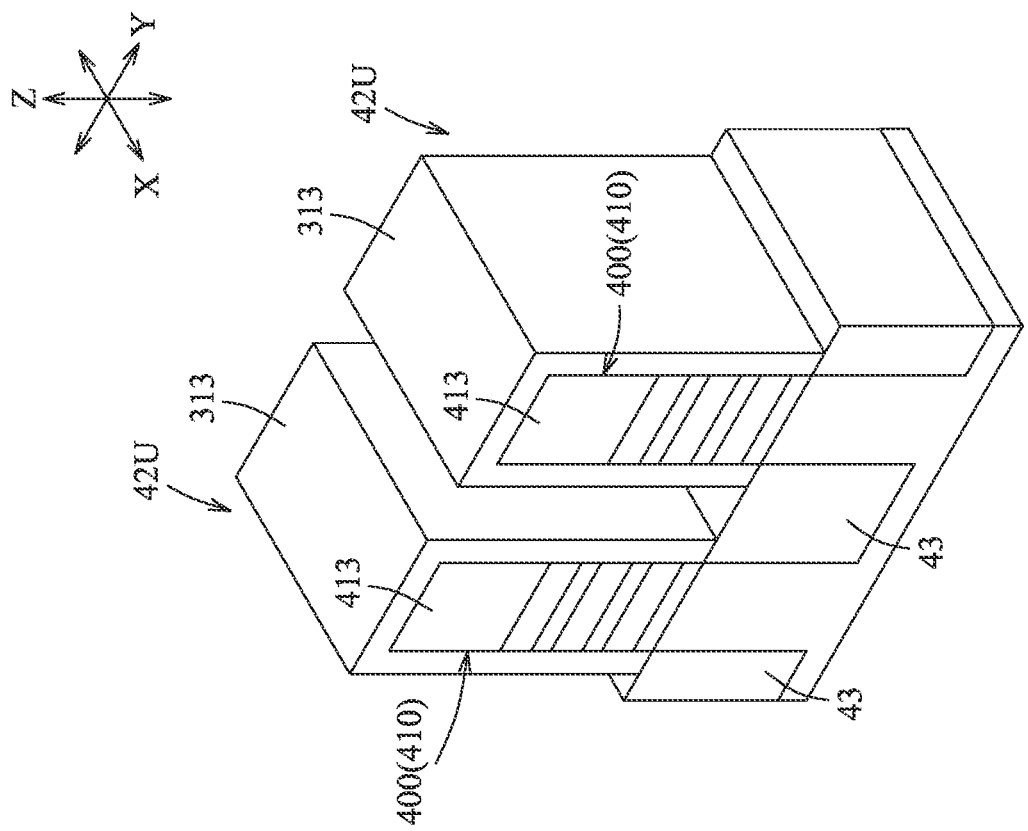

Referring to FIG. 1A and the example illustrated in FIG. 4, the method proceeds to step 103, where third semiconductor layers 313 are formed on the trench isolation elements 43 to respectively wrap the stack segments 410 of the layered elements 400. In FIG. 4, the third semiconductor layers 313 are partially located in upper portions 42U of the trenches 42 and are spaced apart from each other.

The third semiconductor layers 313 may be formed by suitable fabrication techniques such as CVD, ALD, PVD, PECVD, or the like, or combinations thereof, and may include, for example, but not limited to, silicon germanium, or the like. Other suitable techniques and materials for forming the third semiconductor layers 313 are within the contemplated scope of the present disclosure. In some embodiments, the third semiconductor layers 313 may be made of a material same as that of the second semiconductor layers 318.

Figure 5:
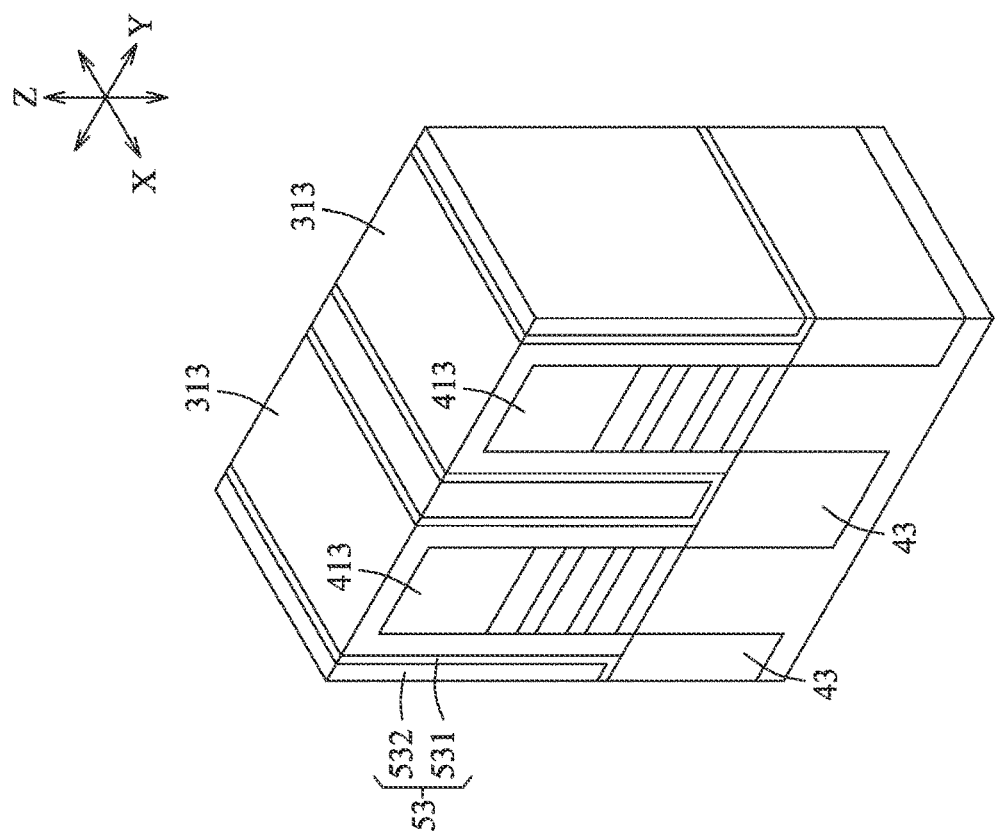

Referring to FIG. 1A and the examples illustrated in FIGS. 4 and 5, the method proceeds to step 104, where first dielectric elements 53 are respectively filled in the remaining segments of the upper portions 42U of the trenches 42.

In some embodiments, each of the first dielectric elements 53 may include a first dielectric film 531 and a first dielectric body 532. The first dielectric film 531 is formed between the first dielectric body 532 and the third semiconductor layers 313 (as shown in FIG. 5). In certain embodiments, the first dielectric film 531 and the first dielectric body 532 are made of different materials. In some embodiments, step 104 may include the following sub-steps: (i) conformally depositing a first dielectric layer, which is for forming the first dielectric film 531, on the third semiconductor layers 313 and on the trench isolation elements 43 exposed from the remaining segments of the upper portions 42U of the trenches 42, (ii) forming a second dielectric layer, which is for forming the first dielectric body 532, on the first dielectric layer until the remaining segments of the upper portions 42U of the trenches 42 are filled, and (iii) removing an excess of the first dielectric layer and the second dielectric layer to expose the third semiconductor layers 313, to thereby form the first dielectric elements 53. The first dielectric layer may be formed using suitable fabrication techniques such as ALD, CVD, PVD, high density plasma CVD (HDPCVD), MOCVD, remote plasma CVD (RPCVD), PECVD, atmospheric pressure CVD (APCVD), selective area CVD (SAVCD), or the like, or combinations thereof. The second dielectric layer may be formed using suitable fabrication techniques such as LPCVD, FCVD, hybrid physical-chemical vapor deposition (HPCVD), high aspect ratio process (HARP), CVD, or the like, or combinations thereof. Removal of the excess of the first and second dielectric layers may be performed using a planarization process, such as CMP, or the like. Other suitable techniques for forming the first dielectric elements 53 are within the contemplated scope of the present disclosure.

The first dielectric film 531 includes a low-k dielectric material which may have a dielectric constant (k) of not greater than about 7. In some embodiments, the low-k dielectric material of the first dielectric film 531 has a dielectric constant (k) of not greater than about 5. In certain embodiments, the first dielectric film 531 may include, for example, a silicon-based dielectric material such as silicon oxide, silicon nitride, silicon oxycarbide, or the like, but not limited thereto. The first dielectric film 531 may be intrinsic or doped with a p-type dopant and/or an n-type dopant. The first dielectric body 532 may include an oxide material such as silicon oxide, or the like, but not limited thereto. The oxide material of the first dielectric body 532 may be the same as the oxide material of the trench isolation elements 43.

Figure 6:
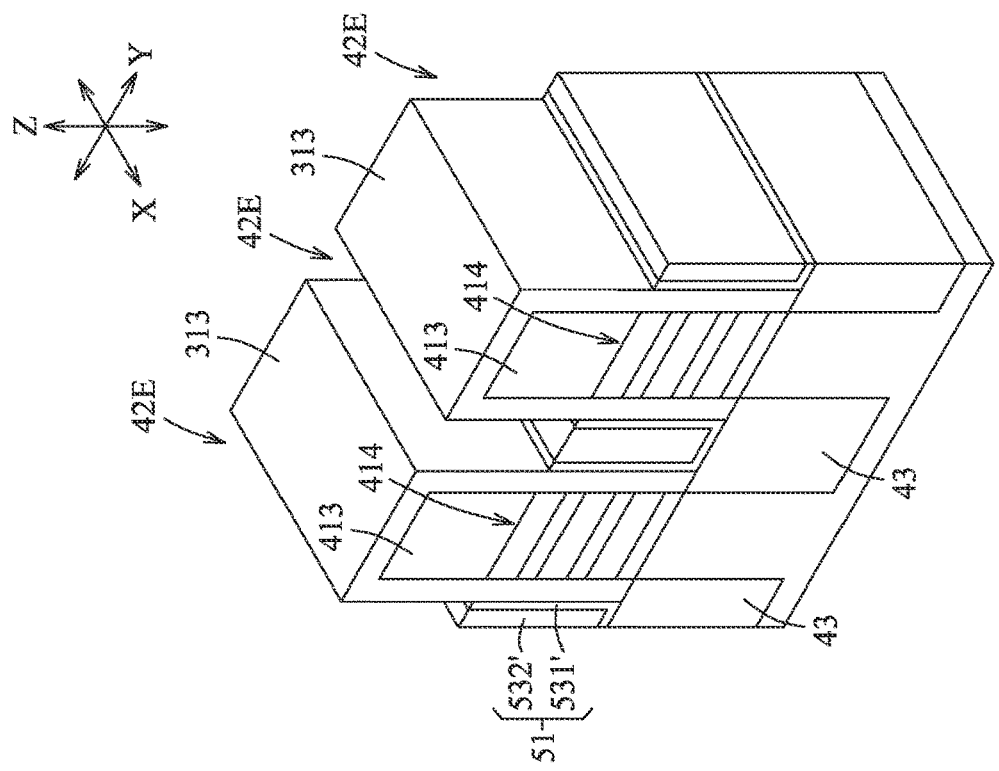

Referring to FIG. 1A and the examples illustrated in FIGS. 5 and 6, the method proceeds to step 105, where the first dielectric elements 53 are partially removed to form isolation bodies 51. After step 105, etching recesses 42E are formed, a remaining part of the first dielectric film 531 is denoted by the numeral 531', and a remaining part of the first dielectric body 532 is denoted by the numeral 532'.

In some embodiments, after step 105, upper surfaces of the isolation bodies 51 are at a level substantially the same as upper surfaces of the nanosheet stacks 414 with respect to upper surfaces of the trench isolation elements 43. In some embodiments, step 105 is performed by an etching process, for example, but not limited to, dry etching, wet etching, other suitable techniques, or combinations thereof. The etching process selectively removes the first dielectric elements 53 with respect to the third semiconductor layers 313. That is, the etching process implements an etchant that has a high etch selectivity for dielectric materials (i.e., the first dielectric elements 53) compared to semiconductor materials (i.e., the third semiconductor layers 313) so that the third semiconductor layers 313 are not or are not substantially removed during step 105. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the first dielectric elements 53.

Figure 7:
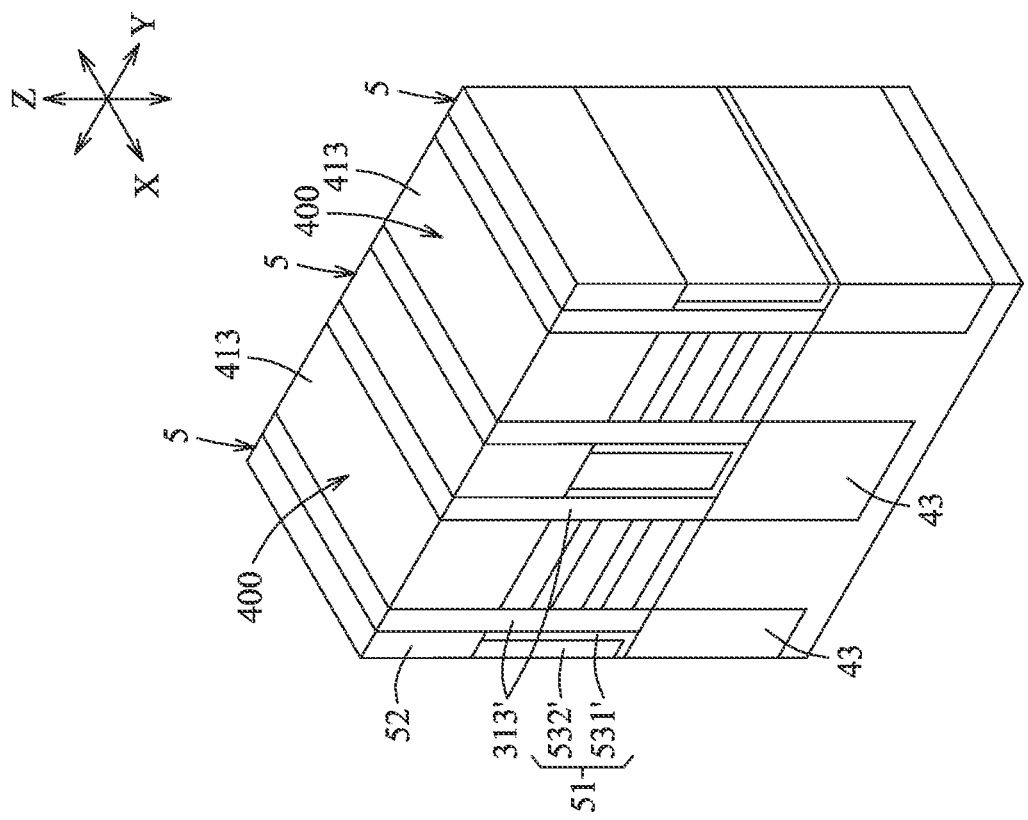

Referring to FIG. 1A and the examples illustrated in FIGS. 6 and 7, the method proceeds to step 106, where isolation features 52 are formed on the isolation bodies 51 to respectively refill the etching recesses 42E, thereby obtaining isolation structures 5 each including one of the isolation features 52 and a corresponding one of the isolation bodies 51. As shown in FIG. 7, one of the isolation features 5 is disposed between and separates the layered elements 400. The isolation features 52 have a dielectric constant greater than that of the isolation bodies 51.

In some embodiments, step 106 may include the following sub-steps: (i) depositing a third dielectric layer, which is for forming the isolation features 52, on the third semiconductor layers 313 and the isolation bodies 51 to refill the etching recesses 42E, and (ii) removing portions of the third semiconductor layers 313 and a portion of the third dielectric layer to expose the layered elements 400. The remaining portion of the third dielectric layer forms the isolation features 52. The third dielectric layer may be formed by suitable fabrication techniques, such as ALD, PVD, CVD, FCVD, or other suitable techniques, but not limited thereto. In some embodiments, the third dielectric layer is formed by PVD.

Removal of the portions of the third semiconductor layers 313 and the portion of the third dielectric layer may be performed using a planarization process, for example, CMP, or other suitable processes, or combinations thereof, to permit an upper surface of the planarized third dielectric layer to be flush with an upper surface of the planarized third semiconductor layers 313 (as shown in FIGS. 6 and 7). In some embodiments, as shown in FIG. 7, after the planarization process, an upper surface of the mask segment 413 of each of the layered elements 400 is exposed. Other suitable planarization processes for forming the isolation features 52 are within the contemplated scope of the present disclosure. After step 106, the third dielectric layer forms into the isolation features 52, and each of the third semiconductor layers 313 forms into two sacrificial segments 313' that are disposed on two opposite sides of a corresponding one of the layered elements 400. In certain embodiments, upper surfaces of the isolation features 52 are flush with the upper surfaces of the mask segments 413 of the first and second layered elements 400, 401.

Figure 8:
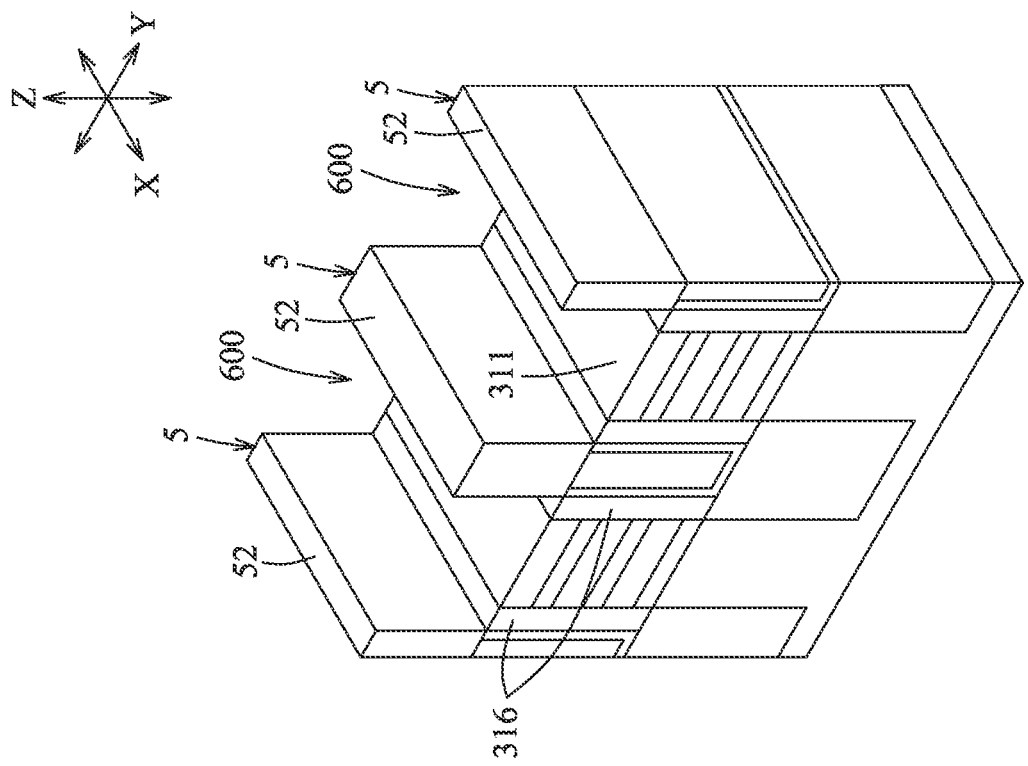

Referring to FIG. 1A and the examples illustrated in FIGS. 7 and 8, the method proceeds to step 107, where the mask segments 413 of the layered elements 400 are removed to leave semiconductor structures 600. In addition, in step 107, upper parts of the sacrificial segments 313' are removed to form sacrificial portions 316 disposed on opposite sides of each of the semiconductor structures 600. In some embodiments, each of the semiconductor structures 600 is a nanosheet structure. In FIG. 8, after step 107, an uppermost one of the first nanosheets 311 in each of the semiconductor structures 600 is exposed. In addition, upper surfaces of the sacrificial portions 316 are at a level substantially the same as upper surfaces of the semiconductor structures 600 and thus, side surfaces of the isolation features 52 are exposed after step 107.

In some embodiments, step 107 may be performed by an etching process, for example, but not limited to, dry etching, wet etching, other suitable processes, or combinations thereof. The etching process selectively removes the mask segments 413 and the upper parts of the sacrificial segments 313' with respect to the first nanosheets 311 and the isolation structures 5. That is, for example, the etching process implements an etchant that has a high etch selectivity for, silicon nitride (i.e., the mask segments 413) and silicon germanium (i.e., the sacrificial segments 313') compared to dielectric materials (i.e., the isolation features 52 of the isolation structures 5) and semiconductor materials (i.e., the first nanosheets 311), so that the first nanosheets 311 and the isolation structures 5 are not substantially removed during removal of the mask segments 413. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the mask segments 413 and the upper parts of the sacrificial segments 313'. In certain embodiments, the etching process may include multiple steps so that the mask segments 413 and the upper parts of the sacrificial segments 313' are removed separately.

Figure 9B:
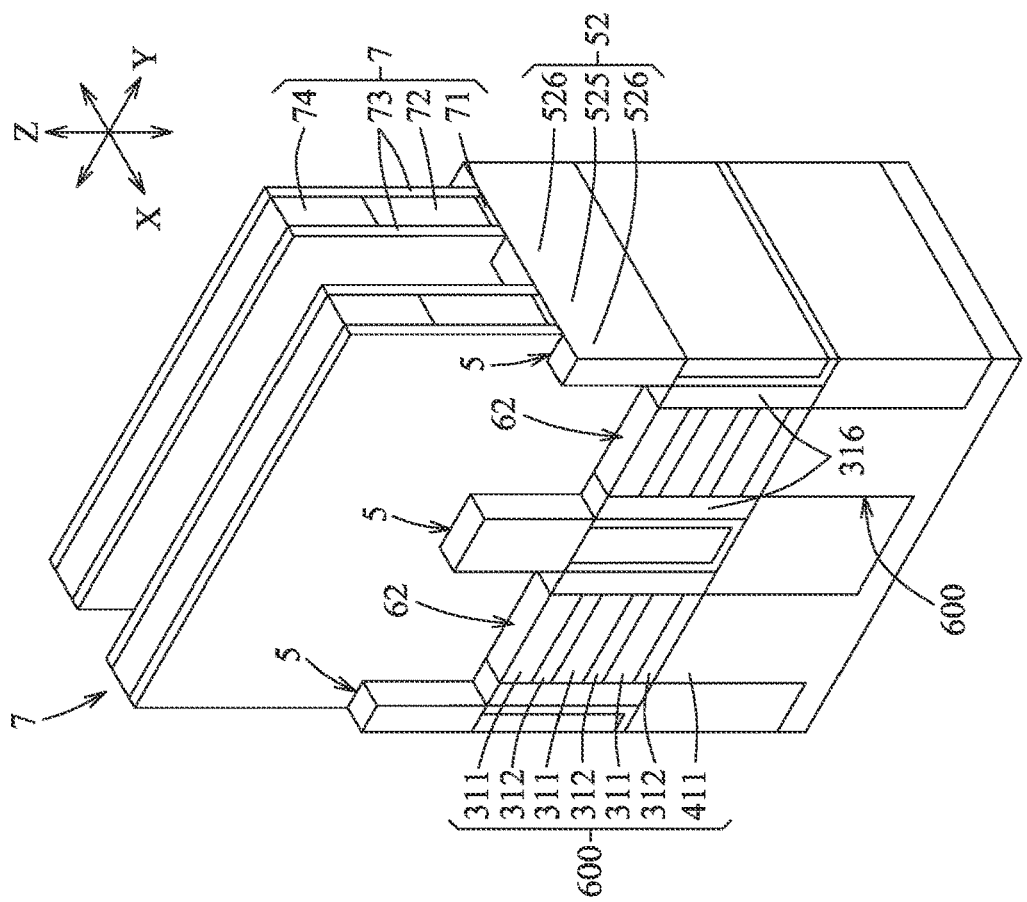
Figure 9A:
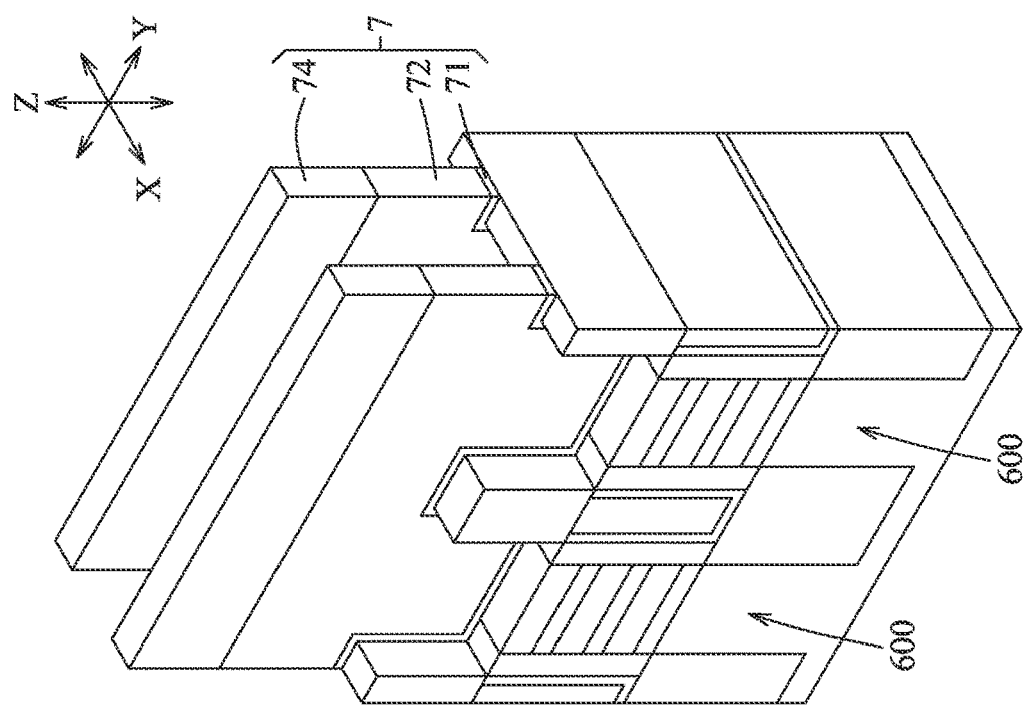

Referring to FIG. 1A and the examples illustrated in FIGS. 9A and 9B, the method proceeds to step 108, where gate features 7, which are spaced apart in an X direction, are formed over the isolation structures 5 and the semiconductor structures 600 such that each of the semiconductor structures 600 has two exposed portions 62 (i.e., portions not covered by the gate features 7) at two opposite sides of each of the gate features 7. In addition, each of the isolation features 52 has an isolation element 525 disposed beneath each of the gate features 7, and two lateral elements 526 which are respectively positioned at two opposite sides of the isolation element 525 and which are exposed from the gate features 7. Each of the gate features 7 includes a dummy dielectric 71 that is disposed in contact with the isolation structures 5, the sacrificial portions 316 and the semiconductor structures 600, a dummy gate 72 that is disposed on the dummy dielectric 71, and two gate spacers 73 (shown in FIG. 9B) that are disposed at two opposite sides of a dummy stack including the dummy gate 72 and the dummy dielectric 71. Each of the gate features 7 extends in a direction different from that of each of the semiconductor structures 600. In FIGS. 9A and 9B, each of the gate features 7 is elongated in a direction (i.e., a Y direction) transverse or orthogonal to an elongated direction of each of the semiconductor structures 600 (i.e., the X direction). In some embodiments, the dummy stack further includes a hard mask 74 disposed on the dummy gate 72.

To form the dummy stack, step 108 may include the following sub-steps: (i) conformally and sequentially forming a dummy dielectric layer, a dummy gate layer and a hard mask layer on the structure shown in FIG. 8, and (ii) patterning the hard mask layer, the dummy gate layer, and the dummy dielectric layer. The dummy dielectric layer, the dummy gate layer and the hard mask layer may be formed using a deposition process, for example, but not limited to, ALD, CVD, PVD, MOCVD, RPCVD, LPCVD PECVD, other suitable techniques, or combinations thereof. The dummy dielectric layer may include a dielectric material, such as silicon oxide, but not limited thereto. The dummy gate layer may include polycrystalline silicon, microcrystal silicon, amorphous silicon, or the like, but not limited thereto. The hard mask layer may include silicon nitride, silicon oxide, silicon oxynitride, or combinations thereof, but not limited thereto. Each of the dummy dielectric layer, the dummy gate layer, and the hard mask layer may include sub-layers. The dummy dielectric layer, the dummy gate layer, and the hard mask layer may be patterned using an etching process, such as a dry etching process, a wet etching process, or the like, or combinations thereof. Before the etching process, a lithography process may be used to develop a resist layer on the hard mask layer. Other materials and processes suitable for forming the dummy stack are within the contemplated scope of the present disclosure.

To form the two gate spacers 73, step 108 may further include the following sub-steps: (iii) forming a gate spacer layer that is disposed to cover the structure shown in FIG. 9A, and (iv) removing portions of the gate spacer layer to form the gate spacers 73 disposed to sandwich the dummy stack. The gate spacers 73 may include, for example, but not limited to, a silicon carbon-containing dielectric material, a silicon oxide-containing material, silicon nitride, other suitable materials, or combinations thereof. The gate spacer layer may be formed using a deposition process, for example, CVD, PVD, PECVD, or the like, or combinations thereof. The portions of the gate spacer layer may be removed using an etching process. The etching process may be an anisotropic etching process such as dry etching, but not limited thereto, and is performed so that remaining portions of the gate spacer layer form into the gate spacers 73 disposed on two opposite sides of the dummy stack. In some embodiments, the gate spacer layer includes sub-layers, and thus, the gate spacers 73 has a layered structure (not shown). In the gate feature 7, a cross-sectional area at an upper portion (i.e., more distal from the semiconductor structures 600) thereof perpendicular to the Z axis may be smaller than that at a lower portion (i.e., more proximal to the semiconductor structures 600) thereof. Other processes and materials suitable for forming the gate spacers 73 are within the contemplated scope of the present disclosure.

Figure 10:
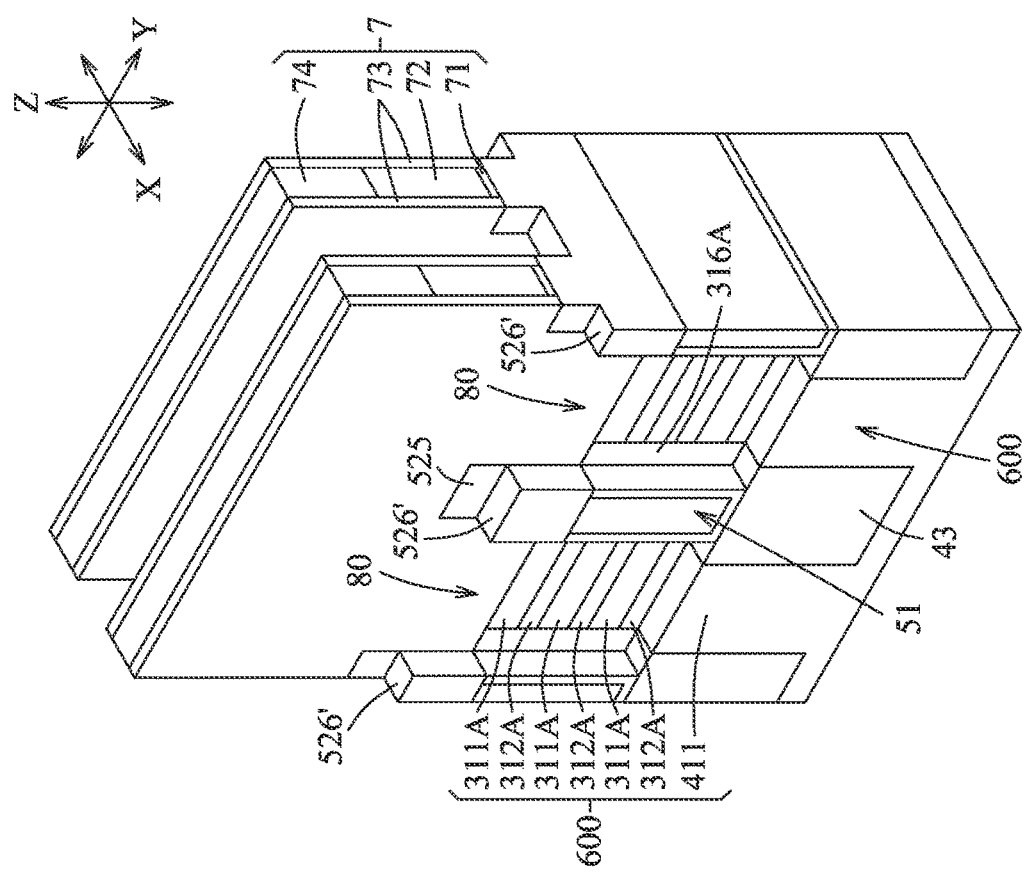

Referring to FIG. 1A and the examples illustrated in FIGS. 9B and 10, the method proceeds to step 109, where source/drain recesses 80 are formed respectively in the exposed portions 62 of each of the semiconductor structures 600. Step 109 may include the following sub-steps: (i) removing the exposed portions 62 of the semiconductor structures 600 so that the first nanosheets 311 are formed into first nanosheet segments 311A, and the second nanosheets 312 are formed into second nanosheet segments 312A, and (ii) removing lateral parts of the sacrificial portions 316 not covered by the gate features 7 so as to leave sacrificial bodies 316A and to expose the trench isolation elements 43. The source/drain recesses 80 are each defined by side surfaces of two adjacent ones of the isolation bodies 51, side surfaces of the sacrificial bodies 316A disposed under a corresponding one of the gate features 7, and side surfaces of the first and second nanosheet segments 311A, 312A of a corresponding one of the semiconductor structures 600. That is, after completing step 109, end regions of each of the first and second nanosheet segments 311A, 312A and the sacrificial bodies 316A are exposed from the source/drain recesses 80.

The source/drain recesses 80 may be formed using a dry etching process, a wet etching process, other suitable etching processes, or combinations thereof. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve formation of the source/drain recesses 80. Other processes suitable for forming the source/drain recesses 80 are within the contemplated scope of the present disclosure. In some embodiments, upper parts of the lateral elements 526 may be removed during formation of the source/drain recesses 80, and remaining parts of the lateral elements 526 are denoted by the numeral 526' (see FIGS. 9B and 10).

Figure 11:
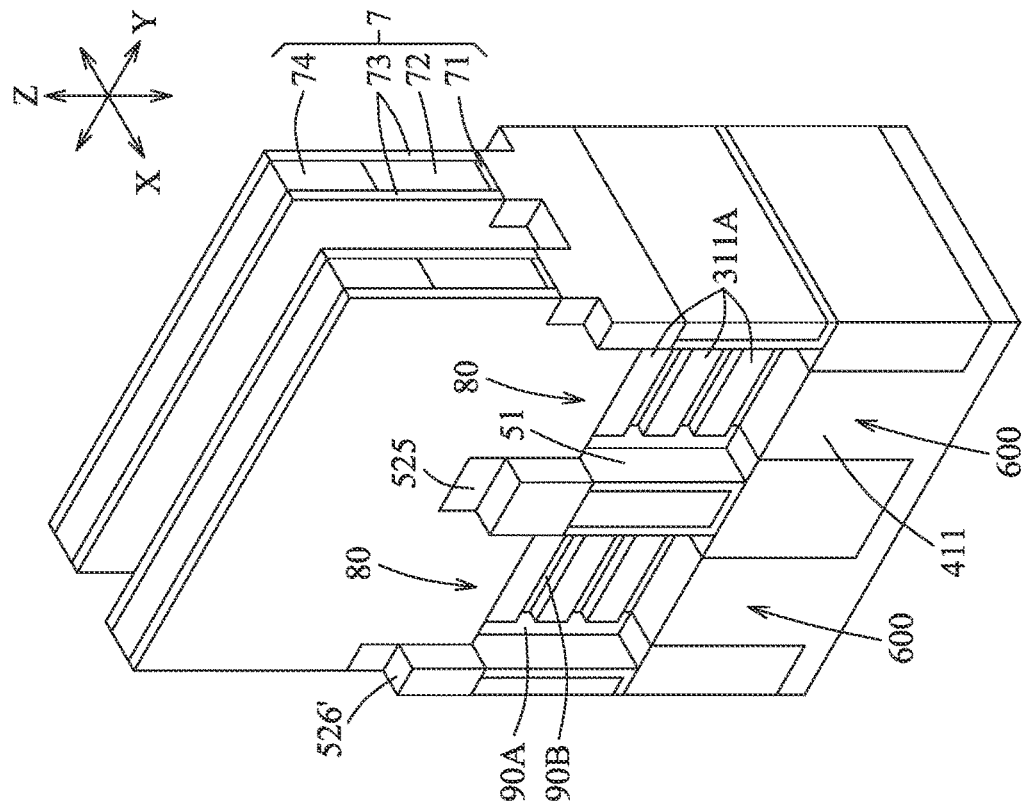

Referring to FIG. 1A and the examples illustrated in FIGS. 10 and 11, the method proceeds to step 110, where end regions of the sacrificial bodies 316A and end regions of the second nanosheet segments 312A are removed so as to form inner gaps 90A and lateral recesses 90B, respectively.

The inner gaps 90A and the lateral recesses 90B are formed under the gate spacers 73 of the gate features 7, and are each located in a corresponding one of the source/drain recesses 80. In some embodiments, each of the inner gaps 90A and the lateral recesses 90B can extend to locate partially under the dummy dielectric 71 of a corresponding one of the gate features 7. The first nanosheet segments 311A under the gate spacers 73 of the corresponding one of the gate features 7 are each separated from adjacent ones of the isolation bodies 51 by a corresponding one of the inner gaps 90A. The first nanosheet segments 311A in each of the semiconductor structures 600 under the gate spacers 73 of the corresponding one of the gate features 7 are separated from one another by the lateral recesses 90B. A lowermost one of the first nanosheet segments 311A is separated from the substrate segment 411 by a lowermost one of the lateral recesses 90B.

Step 110 may be performed using an etching process such as wet etching, or the like, but not limited thereto. The inner gaps 90A and the lateral recesses 90B may be formed by multiple and/or different etching processes, and may not be spontaneously formed. In some embodiments, the etching process implements an etchant having an etch selectivity for silicon germanium (i.e., the sacrificial portions 316 and the second nanosheets 312) to silicon (i.e., the first nanosheets 311). In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve removal of the end regions of the sacrificial bodies 316A and the end regions of the second nanosheet segments 312A. Other suitable processes for forming the inner gaps 90A and the lateral recesses 90B are within the contemplated scope of the present disclosure.

Figure 12:
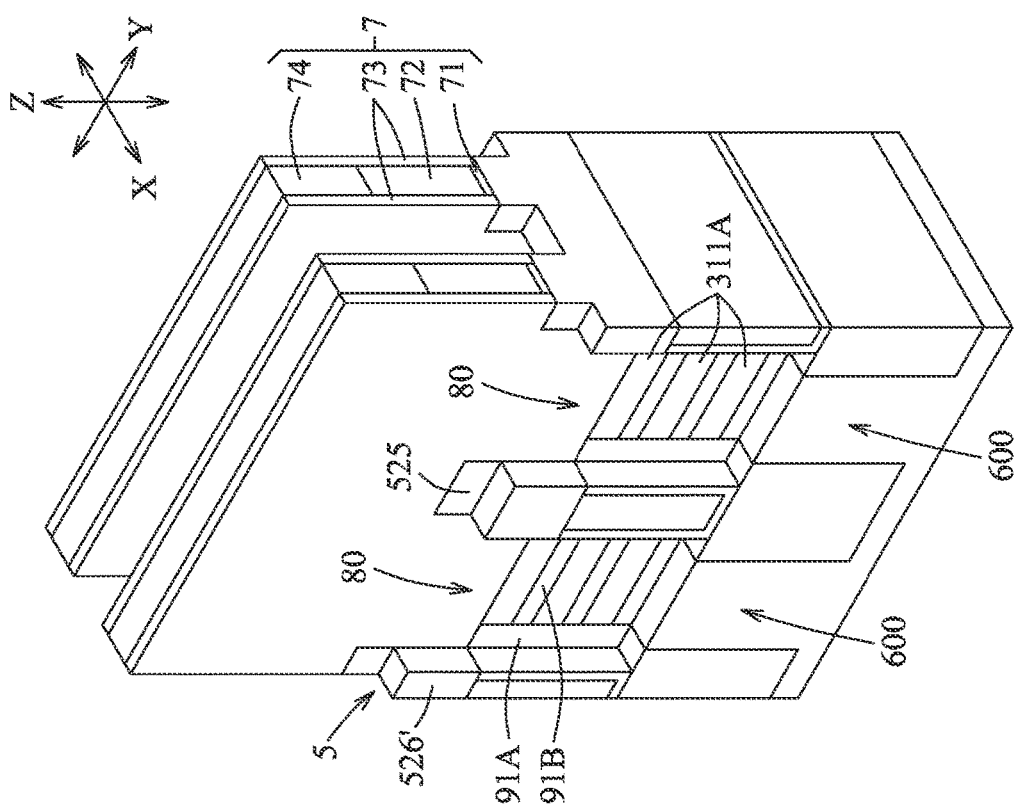

Referring to FIG. 1A and the examples illustrated in FIGS. 11 and 12, the method proceeds to step 111, where first inner spacers 91A and second inner spacers 91B are formed to respectively fill in the inner gaps 90A and the lateral recesses 90B.

In some embodiments, step 111 may include the following sub-steps: (i) forming a spacer layer over the structure shown in FIG. 11, and (ii) removing excess portions of the spacer layer to leave the first inner spacers 91A in the inner gaps 90A, respectively, and to leave the second inner spacers 91B in the lateral recesses 90B, respectively. The spacer layer may be formed by a deposition process, for example, but not limited to, ALD, PVD, CVD, PECVD, plating, other suitable processes, or combinations thereof. Removal of the portions of the spacer layer may be performed using an etching process, for example, but not limited to, a wet etching process, or other suitable techniques. Portions of the spacer layer are removed to expose the end regions of the first nanosheet segments 311A. Remaining portions of the spacer layer partially or completely fill in the inner gaps 90A and the lateral recesses 90B so as to form into the first inner spacers 91A and the second inner spacers 91B. Other processes suitable for forming the first and second inner spacers 91A, 91B are within the contemplated scope of the present disclosure.

The spacer layer may include a dielectric material that includes at least one of, for example, but not limited to, silicon (e.g., silicon oxide), nitrogen (e.g., silicon nitride), oxygen (e.g., silicon oxynitride), carbon (e.g., silicon carbide), or the like. The spacer layer may be intrinsic or doped with a dopant, such as an n-type dopant or a p-type dopant. Other suitable materials for the spacer layer are within the contemplated scope of the present disclosure.

Figure 13:
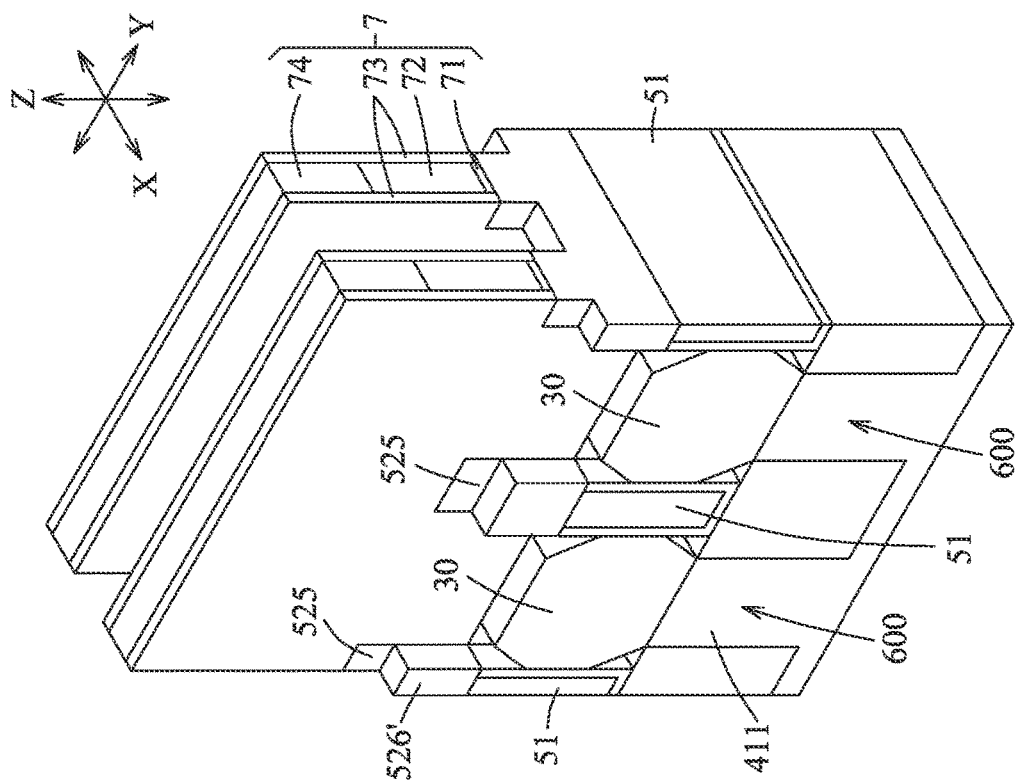

Referring to FIG. 1A and the examples illustrated in FIGS. 12 and 13, the method proceeds to step 112, where source/drain portions 30 are formed respectively in the source/drain recesses 80 of each of the semiconductor structures 600.

In some embodiments, the source/drain portions 30 are formed to completely fill the source/drain recesses 80. In some other embodiments, the source/drain portions 30 do not completely fill the source/drain recesses 80, and the source/drain portions 30 may be spaced apart from the trench isolation elements 43 and/or the isolation structures 5. In certain embodiments, upper surfaces of each of the source/drain portions 30 are at substantially the same level as an upper surface of the uppermost one of the first nanosheet segments 311A. In alternate embodiments, the upper surfaces of each of the source/drain portions 30 are at a level slightly higher than the upper surface of the uppermost one of the first nanosheet segments 311A with respect to an upper surface of the substrate segment 411 of the each of the semiconductor structures 600. The source/drain portions 30 may be formed using an epitaxy growth process, which may involve a deposition process such as CVD, but not limited thereto. The epitaxy growth process may implement a precursor which reacts with the material(s) in the substrate segment 411 and/or the first nanosheet segments 311A. In some embodiments, the source/drain portions 30 of the semiconductor structures 600 are not spontaneously formed. For example, a mask may be used during the epitaxy growth process to mask at least one of the semiconductor structure 600 (not yet formed with the source/drain portions 30) so that the source/drain portions 30 of remaining one(s) of the semiconductor structure 600 are formed before those of the masked one(s) of the semiconductor structure 600. Other processes suitable for forming the source/drain portions 30 are within the contemplated scope of the present disclosure.

In some embodiments, each of the source/drain portions 30 may be formed by, for example, but not limited to, sequentially forming multiple layers of epitaxial layers (not shown) in a corresponding one of the source/drain portions 30, and each of the epitaxial layers may be a semiconductor epitaxial layer doped with a dopant, such as an n-type dopant, a p-type dopant, or a combination thereof. The semiconductor epitaxial layer may include silicon, silicon germanium, silicon carbide, germanium, III-V compound semiconductors, or combinations thereof. In certain embodiments, for an n-type transistor, the source/drain portions 30 include silicon and an n-type dopant(s), such as arsenic, phosphorous, carbon, or the like, or combinations thereof. In some embodiments, for a p-type transistor, the source/drain portions 30 include germanium or silicon germanium and a p-type dopant, such as boron, aluminum, or the like, or combinations thereof. Other materials suitable for the source/drain portions 30 are within the contemplated scope of the present disclosure. The dopants in the source/drain portions 30 may be activated using an annealing process, but not limited thereto. The source/drain portions 30 may be in-situ doped or doped using an ion implantation process, but not limited thereto. Other processes suitable for doping the source/drain portions 30 are within the contemplated scope of the present disclosure.

Figure 14B:
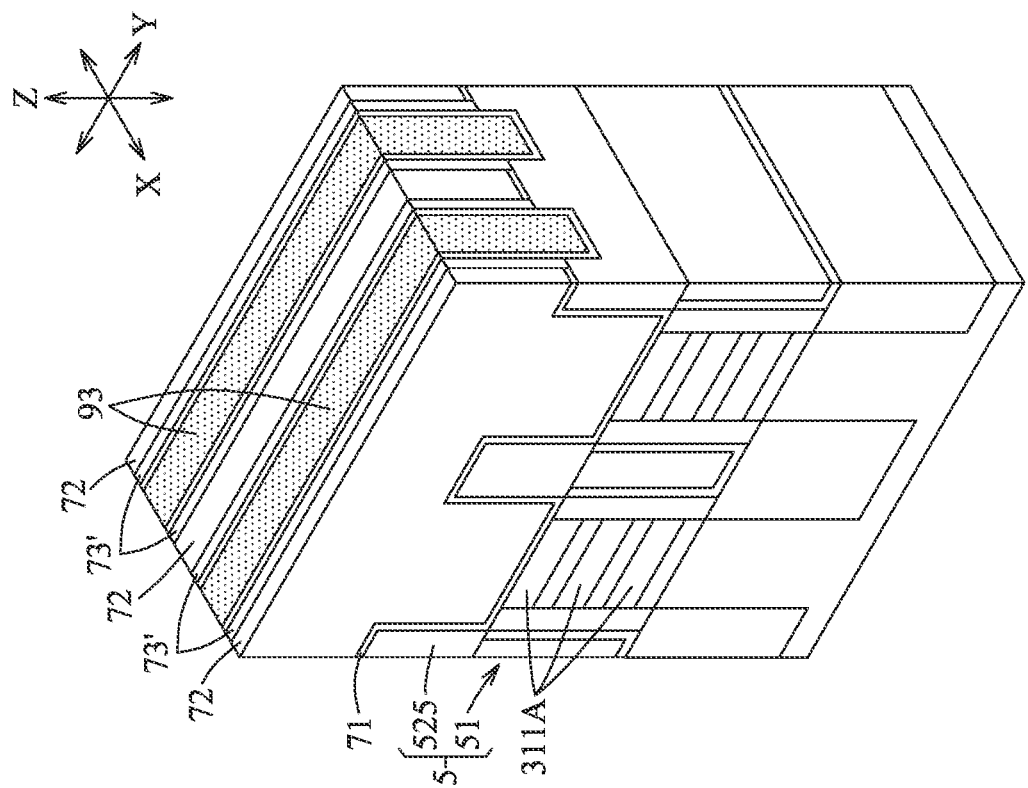
Figure 14A:
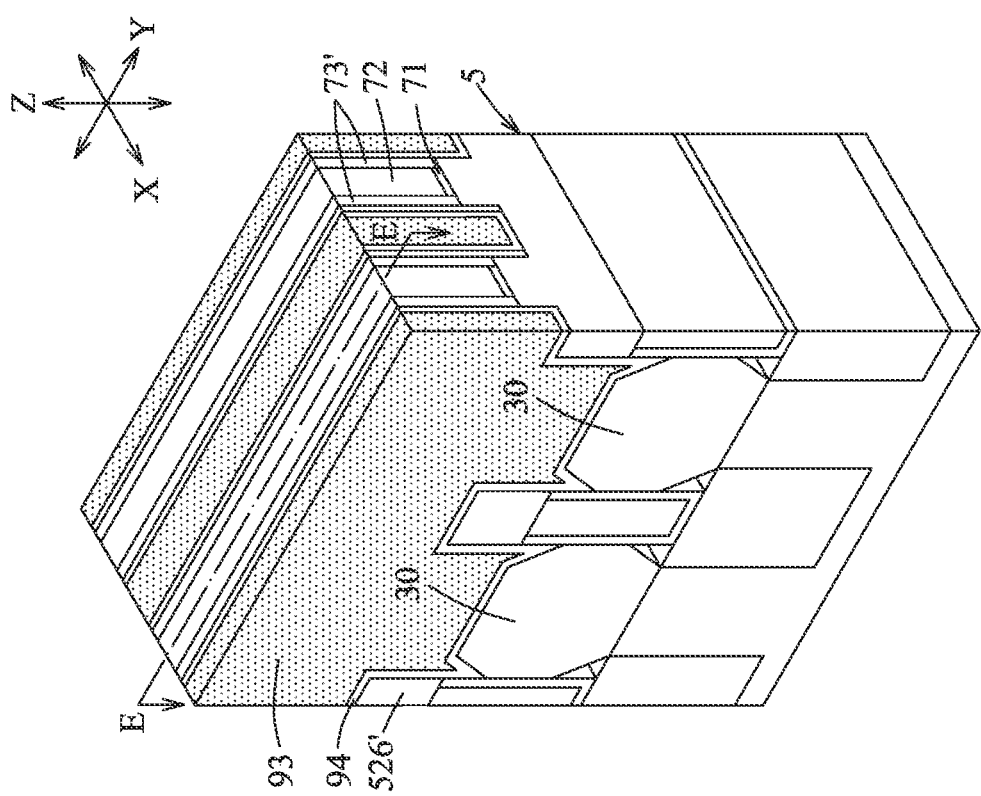

Referring to FIG. 1A and the examples illustrated in FIGS. 13 and 14A, the method proceeds to step 113, where interlayer dielectric (ILD) layers 93 are each disposed to cover corresponding ones of the source/drain portions 3 and portions of the isolation structures 5 aside the corresponding source/drain portions 30 so as to alternate with the gate features 7. In some embodiments, a plurality of contact etch-stop layers (CESLs) 94 are each formed to separate one of the ILD layers 93 from the corresponding source/drain portions 30, the corresponding remaining portions of the isolation structures 5 (each including the isolation body 51 and the isolation element 525), and two adjacent ones of the gate features 7.

In some embodiments, step 113 may include the following sub-steps: (i) conformally forming a CESL material layer for forming the CESLs 94 over the structure shown in FIG. 13, (ii) forming an ILD material layer for forming the ILD layers 93 over the CESL material layer so that a space between each two adjacent ones of the gate features 7 is filled by the CESL and ILD material layers, and (iii) performing a planarization process to remove excess portions of the CESL and ILD material layers to expose the dummy gates 72 of the gate features 7, thereby obtaining the ILD layers 93 and the CESLs 94. The ILD material layer may be formed by a deposition process. The deposition process may be, for example, but not limited to, ALD, PVD, CVD, HARP, HDPCVD, or the like, or combinations thereof. The CESL material layer may be formed by a deposition process such as, for example, but not limited to, ALD, PVD, CVD, or the like, or combinations thereof. The planarization process may be performed using, for example, CMP, but not limited thereto. During the planarization process, portions of the gate features 7 (i.e., portions of the gate spacers 73 and the hard masks 74 of the gate features 7) are removed along with removal of the excess portions of the CESL and ILD material layers. In some other embodiments, the planarization process may be performed to expose the hard masks 74 of the gate features 7. Other processes suitable for performing step 113 are within the contemplated scope of the present disclosure. After step 113, the remaining gate spacers are denoted by numeral 73'.

The ILD material layer includes a dielectric material such as, for example, but not limited to, silicon oxide, silicon nitride, SiON, phosphosilicate glass (PSG), borophosphosilicate glass (BPSG), spin-on glass (SOG), fluorosilicate glass (FSG), carbon-doped silicon oxide (e.g., SiCOH), xerogel, aerogel, parylene, divinylsiloxane-bis-benzocyclobutene-based (BCB-based) dielectric material, polyimide, or the like, or combinations thereof. The ILD material layer may be a low-k dielectric material (i.e., dielectric material having a dielectric constant less than a dielectric constant of silicon oxide). The ILD material layer may be an extreme low-k dielectric material (i.e., dielectric material having a dielectric constant less than about 2.5). The CESL material layer includes a material different from the dielectric material of the ILD material layer. The CESL material layer may include a dielectric material such as, for example, but not limited to, silicon oxide, silicon nitride, or the like, or combinations thereof. The CESL material layer may include a dielectric material that has a dielectric constant less than a dielectric constant of the dielectric material of the ILD material layer. Other materials suitable for the ILD and CESL material layers are within the contemplated scope of the present disclosure.

FIG. 14B is a fragmentary perspective cross-sectional view taken along line E-E of FIG. 14A. In some embodiments, after step 113, upper regions of the ILD layers 93 are etched back to form recesses (not shown) using, for example, but not limited to, a selective etching process, and then masking layers 95 (see FIG. 15) are refilled in the recesses. The refilling of the masking layers 95 may be performed by forming a masking material layer over the CESLs 94 and the remaining regions of the ILD layers 93 to fill the recesses, followed by a planarization process to expose the CESLs 94. The material and process for forming the masking layers 95 are similar to those for the CESLs 94, and the details thereof are omitted for the sake of brevity.

Figure 15:
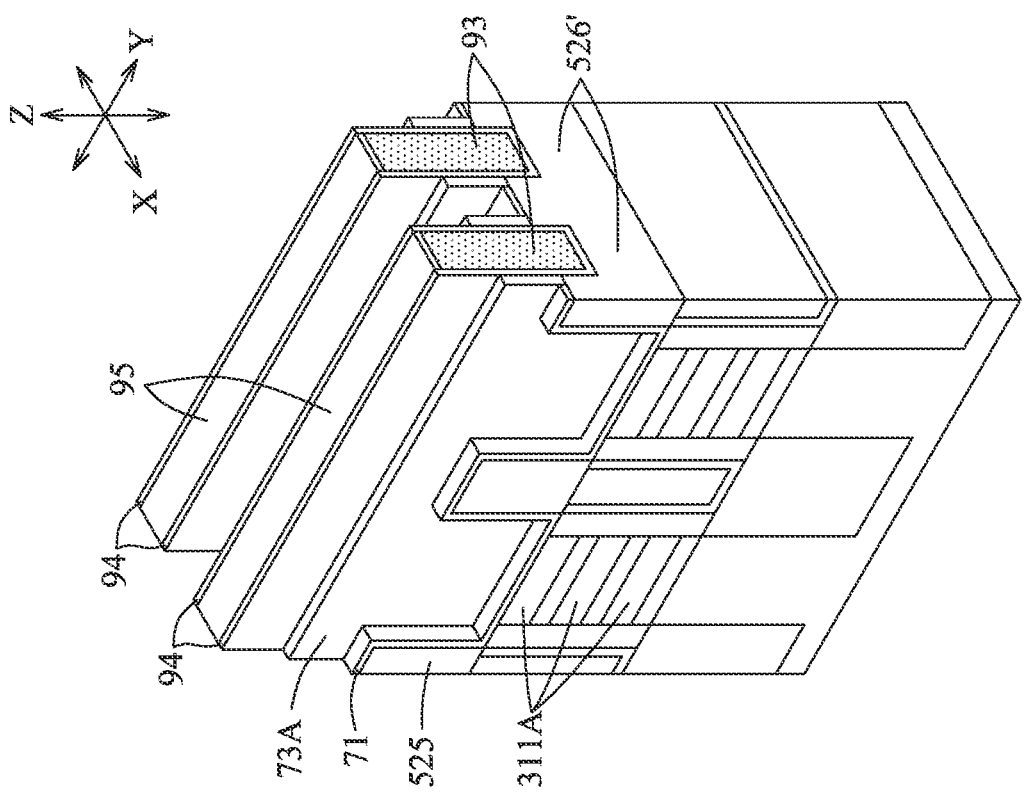

Referring to FIG. 1B and the examples illustrated in FIGS. 14B and 15, the method proceeds to step 114, where the dummy gate 72 of each of the gate features 7 is removed to expose the dummy dielectric 71. For better understanding, FIGS. 15 to 18 illustrate structures subsequent to the structure shown in FIG. 14B (i.e., after step 113).

The dummy gate 72 may be removed using an etching process. The etching process may be, for example, but not limited to, dry etching, wet etching, or the like. The etching process selectively removes the dummy gate 72 with respect to the dummy dielectric 71. For example, the etching process implements an etchant that has a high etch selectivity for silicon (i.e., the dummy gate 72) compared to silicon oxide (i.e., the dummy dielectric 71) so that the dummy dielectric 71 is not or is not substantially removed during removal of the dummy gate 72. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the dummy gate 72. Other suitable processes for removal of the dummy gate 72 are within the contemplated scope of the present disclosure.

In some embodiments, as shown in FIG. 15, after removal of the dummy gates 72, the remaining gate spacers 73' may be etched back using, for example, a dry etching process, a wet etching process, other suitable processes, or combinations thereof. Thereafter, the etch-back gate spacers are denoted by the numeral 73A.

Figure 16:
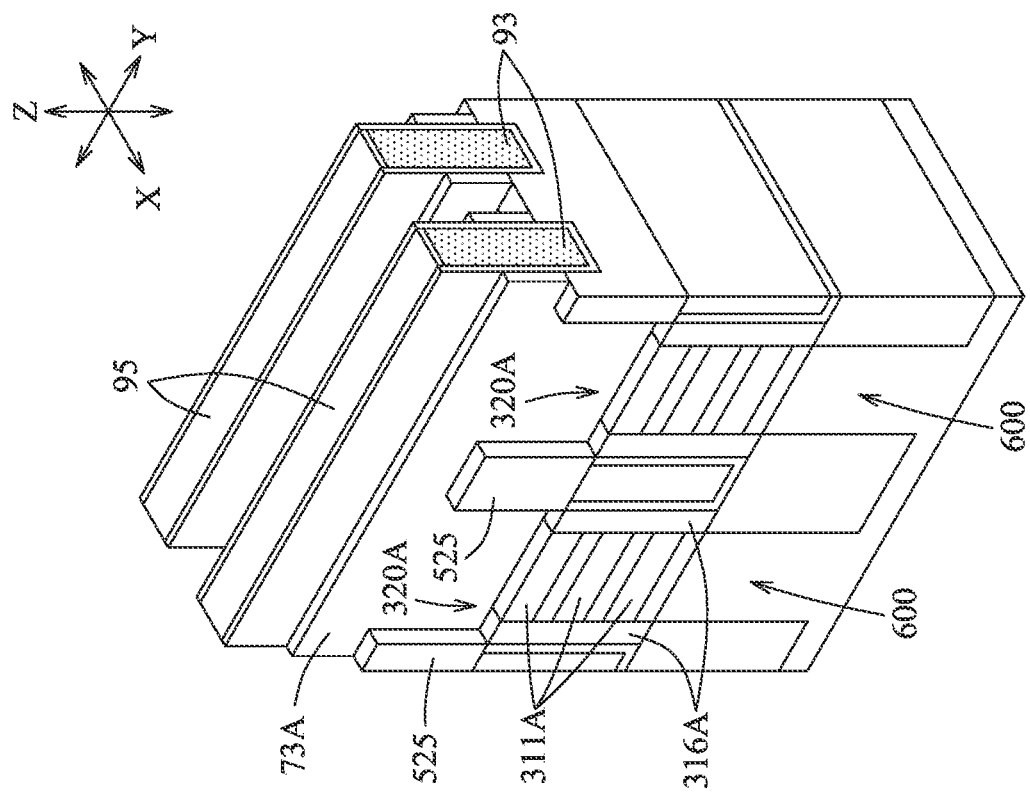

Referring to FIG. 1B and the examples illustrated in FIGS. 15 and 16, the method proceeds to step 115, where the dummy dielectric 71 of each of the gate features 7 is removed to expose partially the upper surface of the uppermost one of the first nanosheet segments 311A, the isolation elements 525, and remaining regions of the sacrificial bodies 316A.

The dummy dielectric 71 may be removed using an etching process. The etching process may be, for example, but not limited to, dry etching, wet etching, or the like. The etching process selectively removes the dummy dielectric 71 with respect to other features of the structure shown in FIG. 15 (e.g., the first nanosheet segments 311A, the gate spacers 73A, etc.). The etching process implements an etchant that has a high etch selectivity for the dummy dielectric 71 compared to the other features of the structure shown in FIG. 15 so that the other features of the structure are not or are not substantially removed during removal of the dummy dielectric 71. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the dummy dielectric 71. Other suitable processes for removal of the dummy dielectric 71 are within the contemplated scope of the present disclosure.

By performing the aforementioned steps 114 and 115, the dummy gate 72 and the dummy dielectric 71 of each of the gate features 7 are removed to form an upper cavity 320A above a corresponding one of the semiconductor structures 600.

Figure 17:
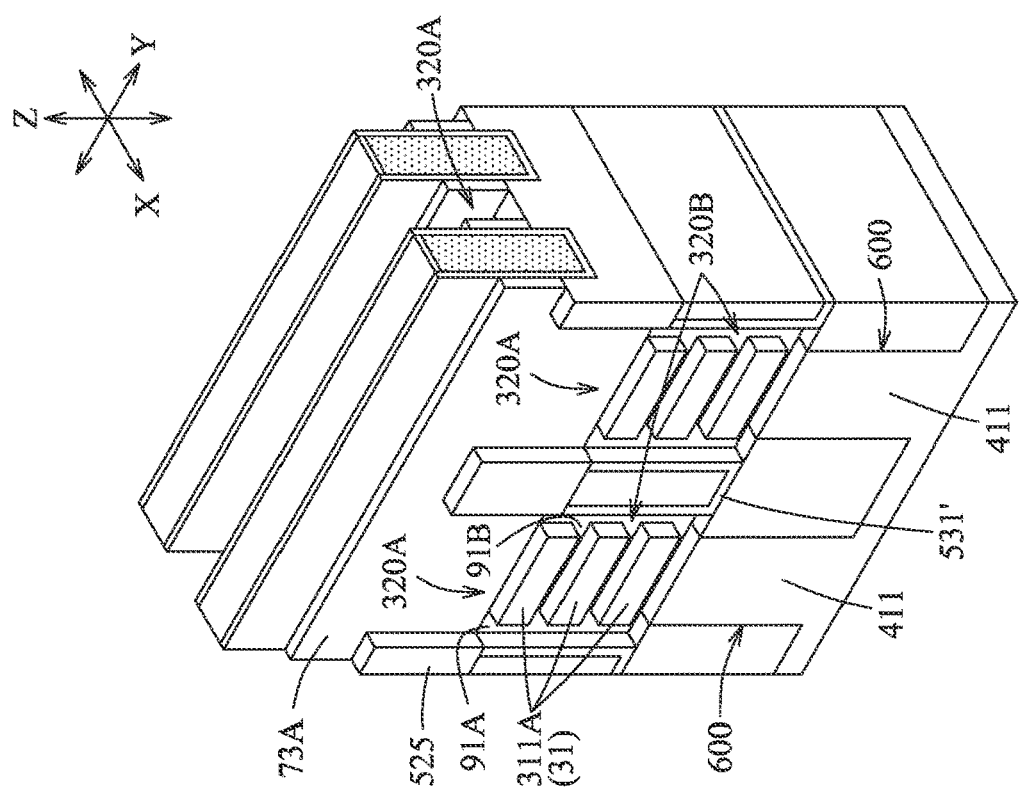

Referring to FIG. 1B and the examples illustrated in FIGS. 16 and 17, the method proceeds to step 116, where the remaining regions of the sacrificial bodies 316A and remaining regions of the second nanosheet segments 312A in each of the semiconductor structures 600 are removed through the upper cavity 320A so as to form a lower cavity 320B. The first nanosheet segments 311A, the first inner spacers 91A, the second inner spacers 91B, and parts of the substrate segments 411 located under the first nanosheet segments 311A of each of the semiconductor structures 600 are exposed. The first nanosheet segments 311A in each of the semiconductor structures 600 serve as a channel portion 31 of the device.

In some embodiments, step 116 may include the following sub-steps: (i) removing the remaining regions of the sacrificial bodies 316A, and (ii) removing the remaining regions of the second nanosheet segments 312A. In certain embodiments, prior to the sub-steps (i) and (ii) of step 116, a cleaning process may be performed using, for instance, hot deionized water, followed by removal of any undesired oxide on surfaces of the structure shown in FIG. 16. In some embodiments, sub-steps (i) and (ii) of step 116 may be performed using an etching process such as, for example, but not limited to, a dry etching process, or the like, or combinations thereof. The etching process selectively removes the remaining regions of the sacrificial bodies 316A and the remaining regions of the second nanosheet segments 312A with respect to other features of the structure shown in FIG. 17 (e.g., the first nanosheet segments 311A, the gate spacers 73A, etc.). The etching process implements an etchant that has a high etch selectivity for the remaining regions of the sacrificial bodies 316A and the remaining regions of the second nanosheet segments 312A compared to the other features of the structure so that the other features of the structure are not or are not substantially removed during step 116. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve removal of remaining regions of the sacrificial bodies 316A and remaining regions of the second nanosheet segments 312A. Other suitable processes for removal of the remaining regions of the sacrificial bodies 316A and the remaining regions of the second nanosheet segments 312A are within the contemplated scope of the present disclosure.

Figure 18:
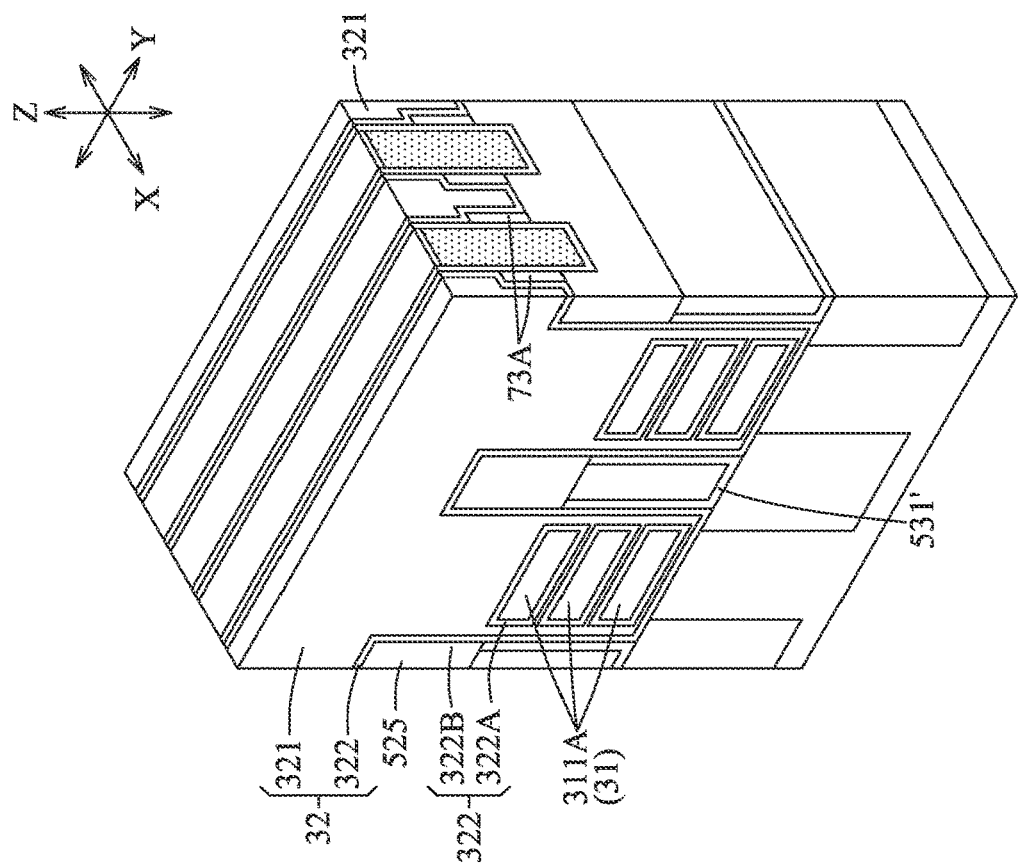

Referring to FIG. 1B and the examples illustrated in FIGS. 17 and 18, the method proceeds to step 117, where gate structures 32 are each formed in the upper and lower cavities 320A, 320B of a corresponding one of the semiconductor structures 600 to surround the channel portion 31 (i.e., surrounding the first nanosheet segments 311A). In addition, the gate structures 32 are each in contact with corresponding ones of the first inner spacers 91A, corresponding ones of the second inner spacers 91B, and corresponding ones of the exposed parts of the substrate segments 411 in step 116, corresponding ones of the exposed surfaces of the remaining parts 531' in step 116, corresponding ones of the isolation elements 525, and corresponding ones of the gate spacers 73A. The gate structures 32 may each include a gate electrode 321 and a gate dielectric 322 having a plurality of first dielectric regions 322A, each of which is disposed to separate the gate electrode 321 from a corresponding one of the first nanosheet segments 311A, and a second dielectric region 322B that is disposed to separate the gate electrode 321 from the two adjacent ones of the source/drain portions 30.

In some embodiments, step 117 may include the following sub-steps: (i) conformally forming a gate dielectric layer for forming the gate dielectric 322 over the structure shown in FIG. 17, (ii) forming a gate electrode layer for forming the gate electrode 321 on the gate dielectric layer to fully fill the upper and lower cavities 320A, 320B in each of the semiconductor structures 600, and (iii) performing a planarization process to remove excess portions of the gate dielectric layer and the gate electrode layer so as to form the gate structures 32. The gate dielectric layer and the gate electrode layer may each be formed using a deposition process, such as ALD, CVD, PVD, or the like, or combinations thereof. The planarization process may be, for example, CMP, or the like, but not limited thereto. Other suitable processes for forming the gate structures 32 are within the contemplated scope of the present disclosure.

The gate dielectric layer includes a high-k dielectric material such as, for example, but not limited to, Hf-based dielectric materials, Zr-based dielectric materials, Al-based dielectric materials, Ti-based dielectric materials, Ba-based dielectric materials, nitrides, or the like, or combinations thereof. The gate electrode layer includes a conductive material such as, for example, but not limited to, a metal (e.g., copper, aluminum, titanium, tantalum, cobalt, tungsten, or the like, or alloys thereof), polysilicon, metal-containing nitrides (e.g., TaN), metal-containing silicides (e.g., NiSi), metal-containing carbides (e.g., TaC), or the like, or combinations thereof. Other suitable materials for forming the gate dielectric layer and the gate electrode layer are within the contemplated scope of the present disclosure.

Figure 19A:
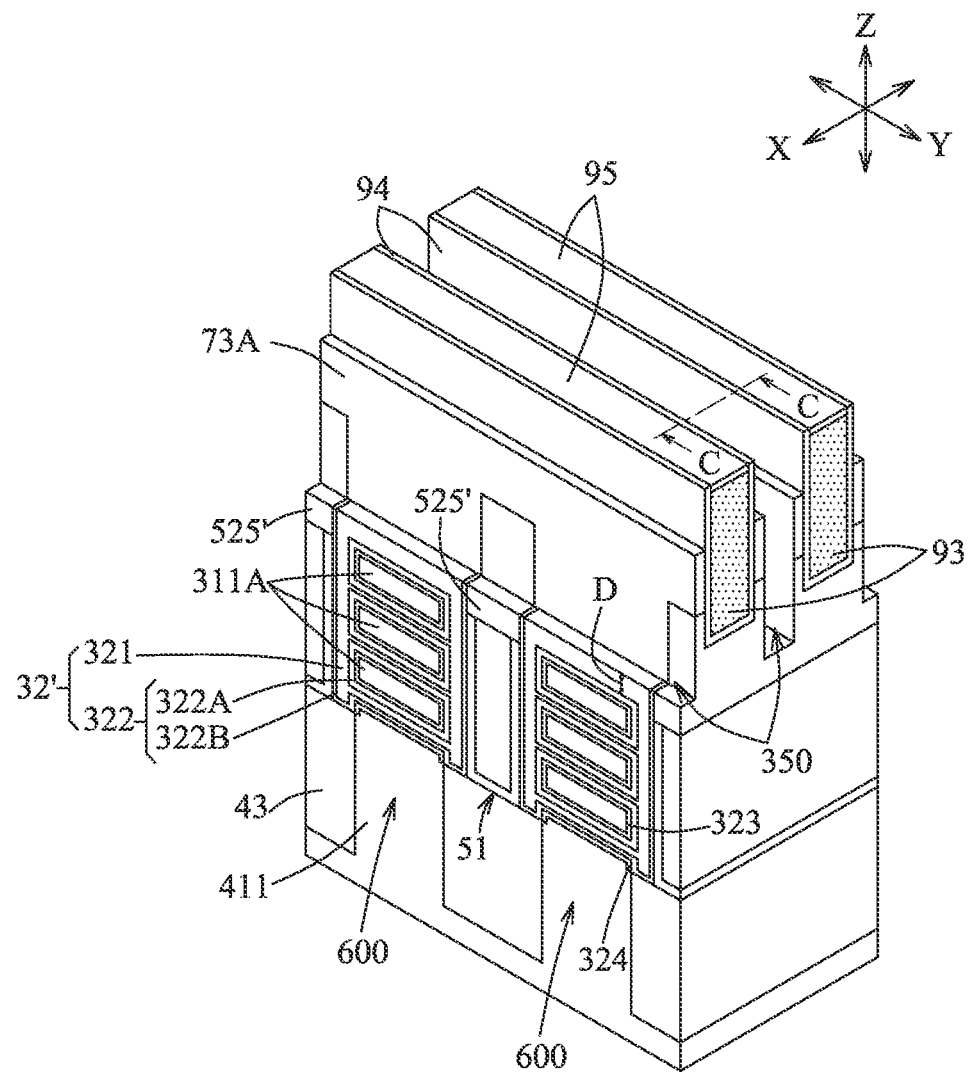
Figure 19B:
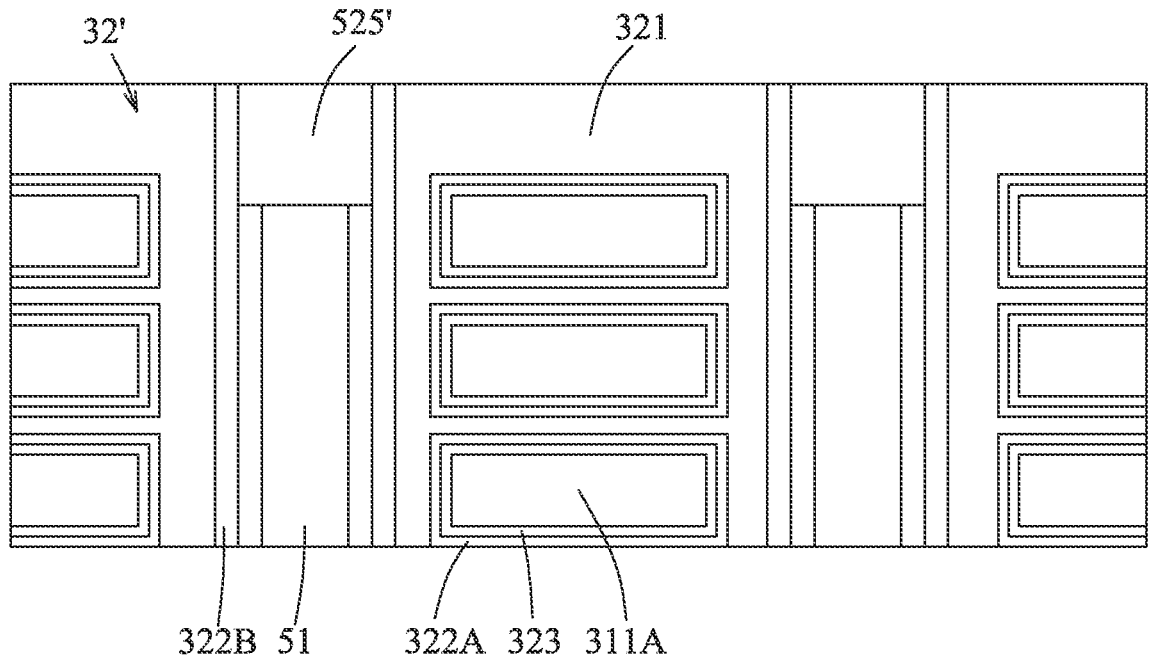
Figure 19C:
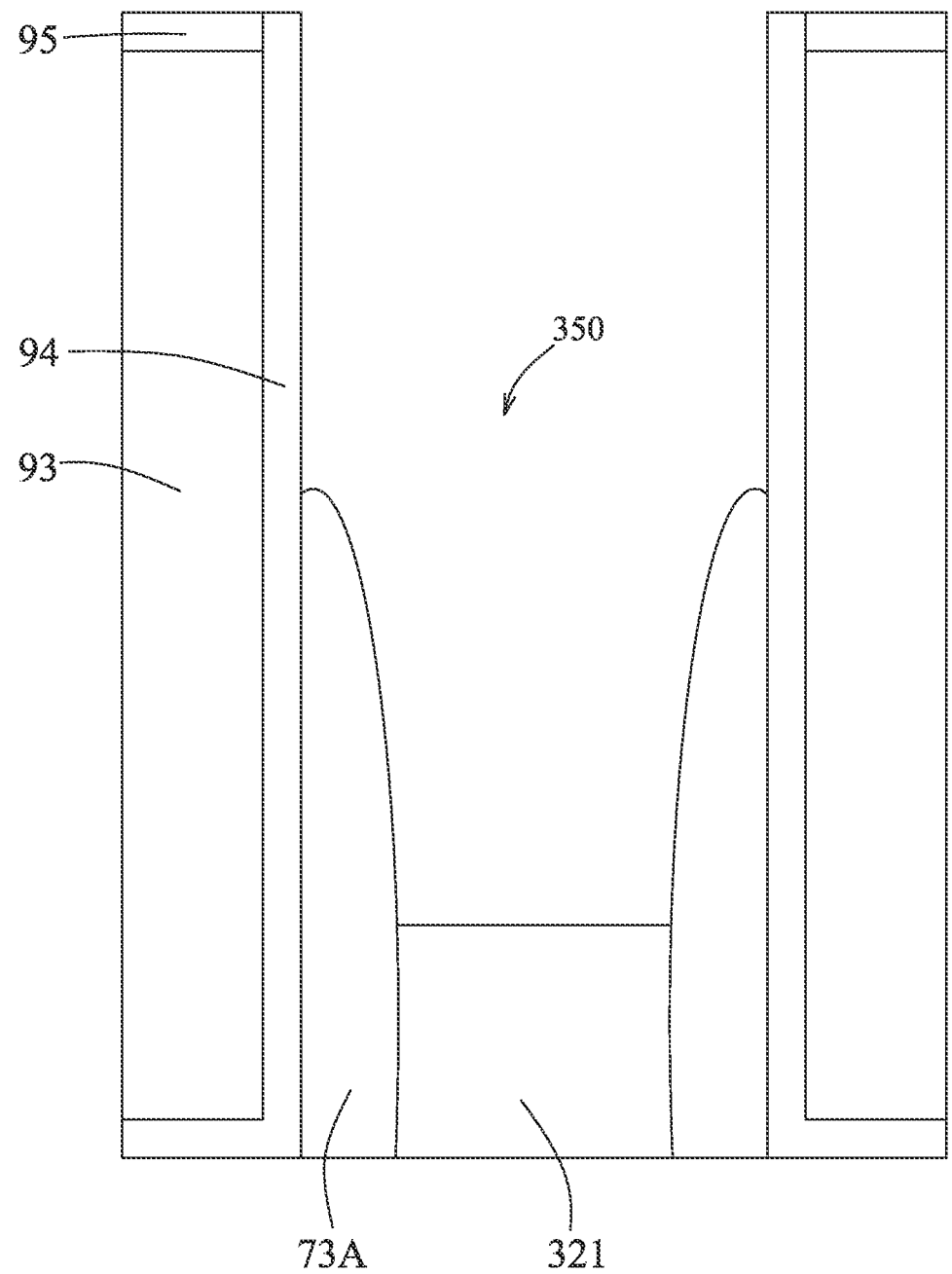

Referring to FIG. 1B and the examples illustrated in FIGS. 18 and 19A, the method proceeds to step 118, where each of the gate structures 32 is etched back so as to form a trench 350 on each of the etched gate structures 32' (after step 118, a remaining portion of the gate electrode 321 and a remaining portion of the gate dielectric 322 of each of the gate structures 32 may be referred as the etched gate structures 32') and between two adjacent ones of dielectric portions which are located respectively on the two adjacent ones of the source/drain portions 30. In some embodiments, each of the dielectric portions includes one of the masking layers 95 and two corresponding ones of the CESLs 94 at two opposite sides of the one of the masking layers 95. In some embodiments, an upper portion of each of the isolation elements 525 is also etched back during etching back of the gate structures 32. The etched isolation elements are denoted by numeral 525'. In this case, the trench 350 is defined by one of the etched gate structures 32', two corresponding ones of the CESLs 94 and two corresponding ones of the gate spacers 73A at two opposite sides of the one of the etched gate structures 32', and corresponding ones of the etched isolation elements 525'. The structure shown in FIG. 19A is similar to that of the FIG. 18, except that an interfacial layer (IL) 323 is formed between each of the first nanosheet segments 311A and a corresponding one of the first dielectric regions 322A, and an additional IL 324 is formed between the second dielectric region 322B and the substrate segment 411. In addition, the substrate segment 411 is slightly higher than the trench isolation elements 43 in the structure shown in FIG. 19A. FIG. 19B is a fragmentary front side view illustrating the first nanosheet segments 311A, the etched gate structures 32', the etched isolation elements 525', and the isolation body 51 which are at least partially shown in FIG. 19A. FIG. 19C is an enlarged cross-sectional view taken along line C-C of FIG. 19A. FIGS. 20A to 22 and 24 to 28 illustrate structures subsequent to the structure shown in FIG. 19A (i.e., after step 118).

The etching back of the gate structure 32 and the isolation elements 525 may be performed using an etching process such as, for example, but not limited to, a dry etching process, a wet etching process, or combinations thereof. The etching process selectively removes a portion of the gate electrode 321, a portion of the gate dielectric 322 and a portion of the isolation elements 525 with respect to other features of the structure shown in FIG. 19A (e.g., the gate spacer 73A, etc.). The etching process implements an etchant that has a high etch selectivity for the portion of the gate electrode 321, the portion of the gate dielectric 322 and the portion of the isolation elements 525 compared with the etch selectivity for other features of the structure so that the other features of the structure are not substantially removed in this step. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve such selective removal. Other suitable processes for removal of the portion of the gate electrode 321, the portion of the gate dielectric 322 and the portion of the isolation elements 525 are within the contemplated scope of the present disclosure.

In some embodiments, for the remaining portion of the gate electrode 321, an upper surface thereof is spaced apart from the first dielectric region 322A surrounding the uppermost first nanosheet segments 311A by a distance (D) which ranges from about 5 nm to about 40 nm, such as 15 nm, depending on design of the device, so that the resultant device may have good electrical properties.

Figure 20A:
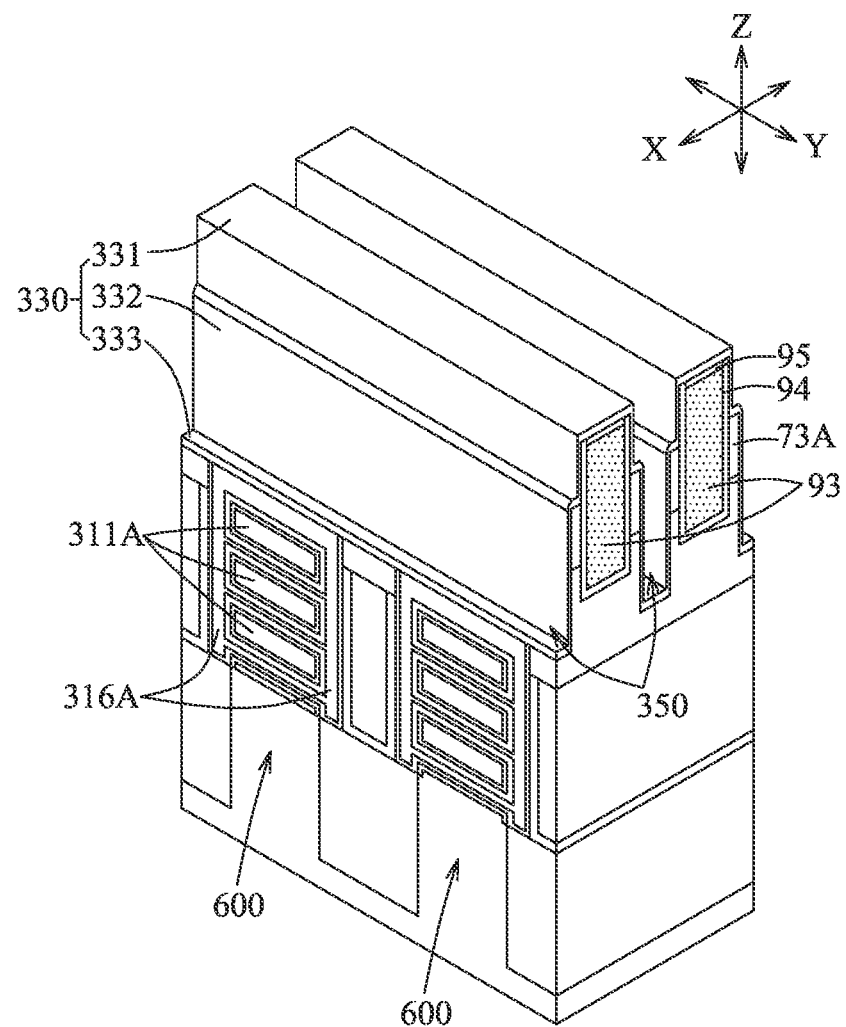
Figure 20B:
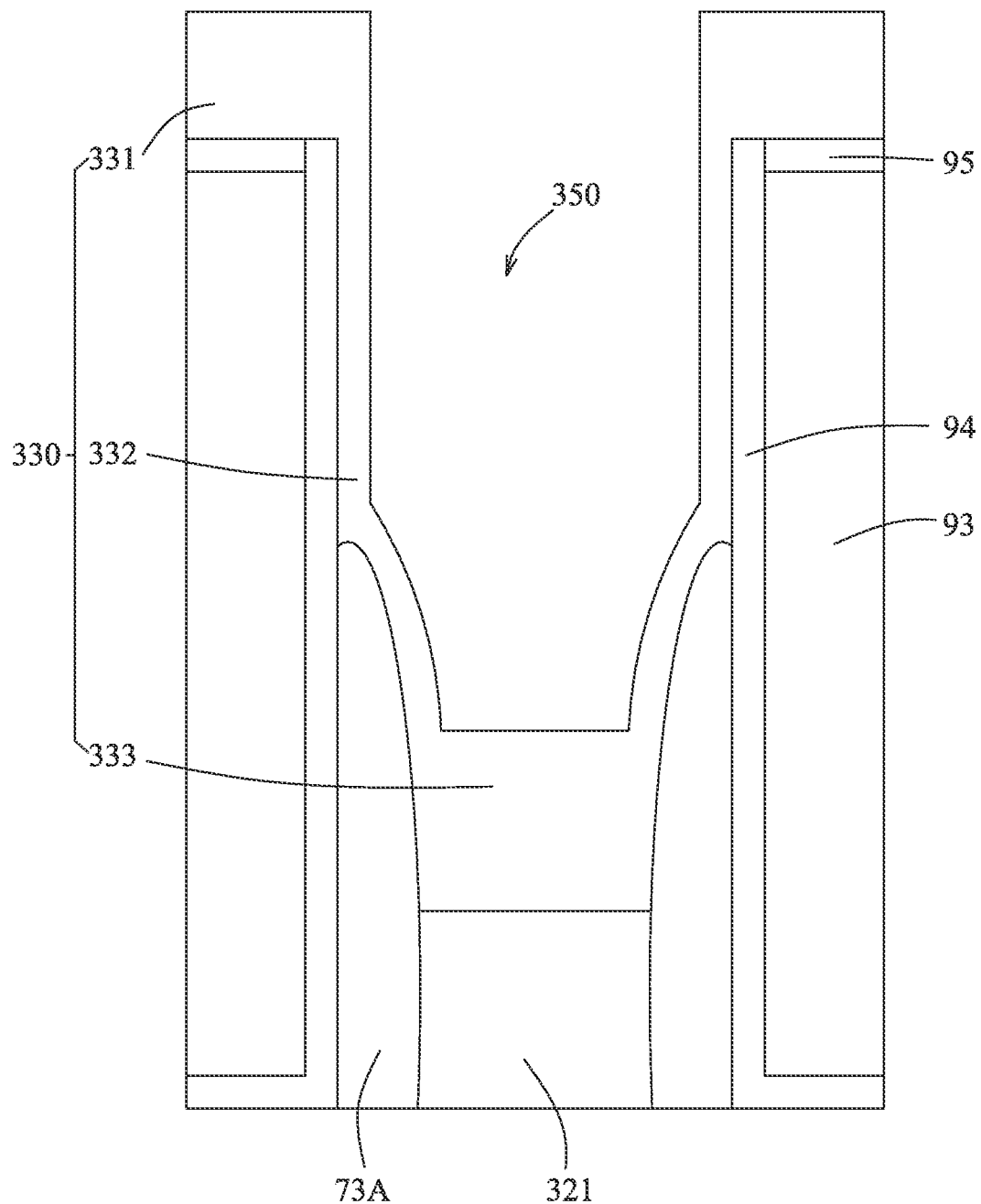

Referring to FIG. 1B and the example illustrated in FIG. 20A, the method proceeds to step 119, where a tungsten-including layer 330 is formed over the structure shown in FIG. 19A. FIG. 20B is a view similar to that of FIG. 19C, but showing the structure after step 119.

The tungsten-including layer 330 may include at least tungsten. Other suitable materials for forming the tungsten-including layer 330 are within the contemplated scope of the present disclosure.

The tungsten-including layer 330 has a first portion 333 formed on a trench bottom of the trench 350, a second portion 332 formed on a trench sidewall of the trench 350, and a third portion 331 formed on an upper surface of each of the dielectric portions (e.g., upper surfaces of the CESLs 94 and the masking layers 95). In some non-shown embodiments, the trench 350 may be formed in a dielectric layer (which may be also illustrated by the CESLs 94 and the masking layers 95), and the first portion 333, the second portion 332, and the third portion 331 of the tungsten-including layer 330 may be respectively formed on the trench bottom of the trench 350, the trench sidewall of the trench 350, and an upper surface of the dielectric layer. In some embodiments, the tungsten-including layer 330 may be formed by, for instance, but not limited to, a PVD process. Referring to FIG. 20B, to facilitate step 121 to be performed subsequently (to be described hereinafter), the parameters (for example, but not limited to, temperature, pressure, time period, species of an inert gas for the PVD process, energy distribution during the PVD process, and so on) for formation of the tungsten-including layer 330 may be adjusted such that the first and third portions 333, 331 each has a similar thickness that is greater than a thickness of the second portion 332. In some embodiments, for the second portion 332, the section located on the gate spacer 73A may have a thickness greater than that located on the CESLs 94. Other suitable processes for forming the tungsten-including layer 330 are within the contemplated scope of the present disclosure.

Figure 21:
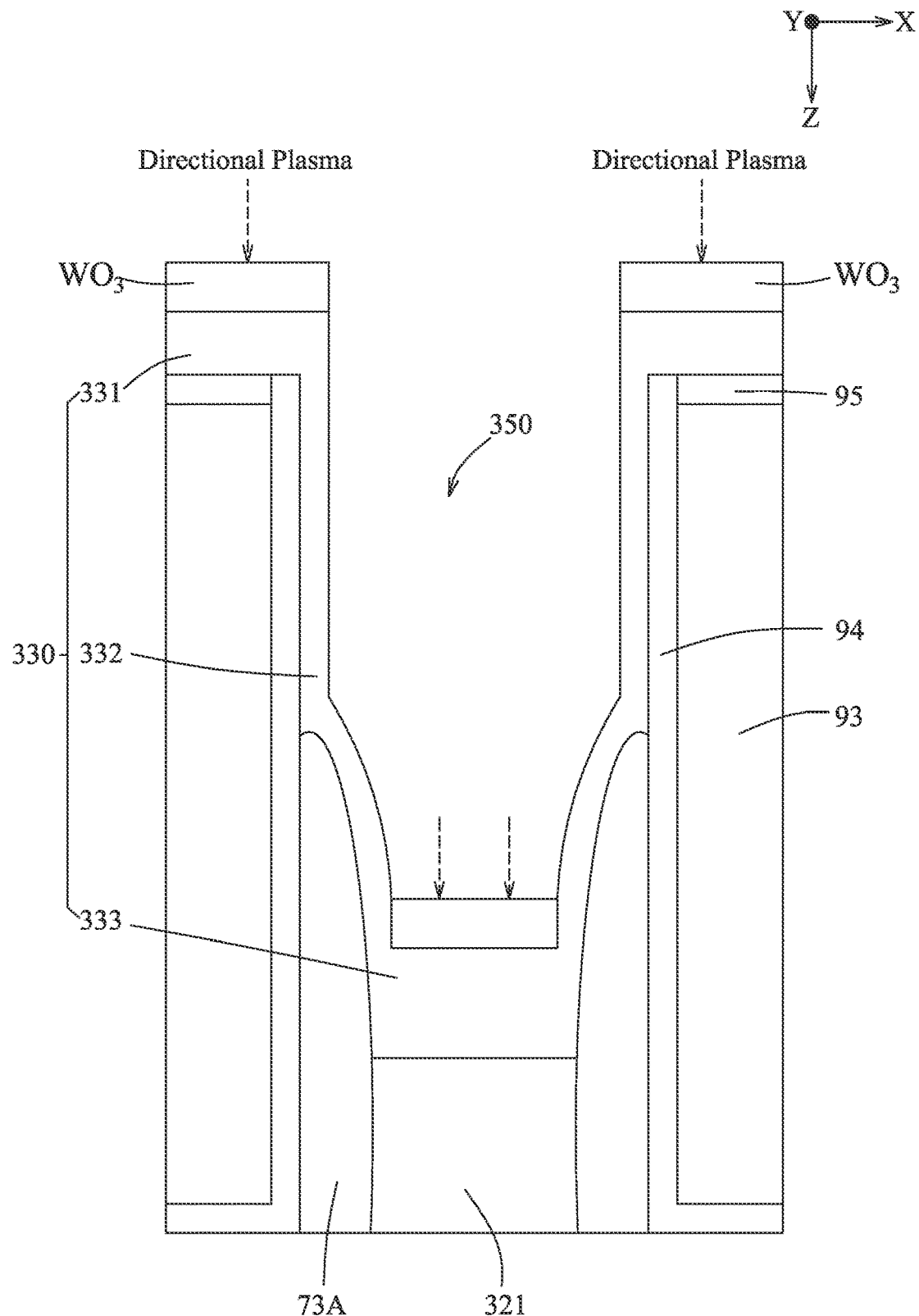

Referring to FIG. 1B and the example illustrated in FIG. 21, the method proceeds to step 120, where a directional treatment is performed so as to convert tungsten in a surface region of each of the first and third portions 333, 331 of the tungsten-including layer 330 into tungsten oxide.

In some embodiments, the directional treatment is performed using a directional $O_2$ plasma. That is, the $O_2$ plasma is applied in the Z direction, such that portions of the tungsten-including layer 330 exposed in the Z direction, e.g., the first and third portions 333, 331, are subjected to the directional treatment. In some embodiments, a power for generating the $O_2$ plasma ranges from about 10 W to about 100 W. In other embodiments, the power for generating the $O_2$ plasma may range from about 20 W to about 100 W. Other parameters for performing the directional treatment, e.g., oxygen gas concentration, gas temperature, working pressure, distance between nozzle and wafer, process time, etc. is tunable to achieve the conversion of tungsten into tungsten oxide in the surface region of each of the first and third portions 333, 331. Other suitable processes or reagents (e.g. Ar) for selectively converting tungsten in the surface region of mainly the first and third portions 333, 331 into tungsten oxide are within the contemplated scope of the present disclosure.

Figure 22A:
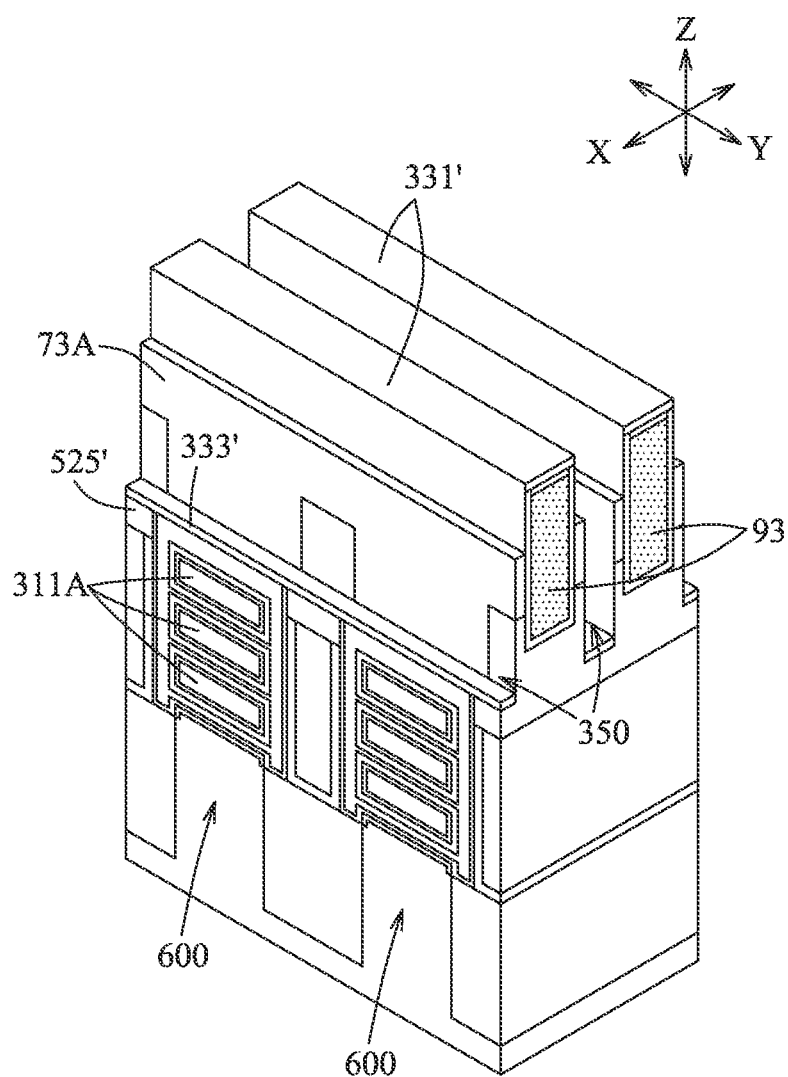
Figure 22B:
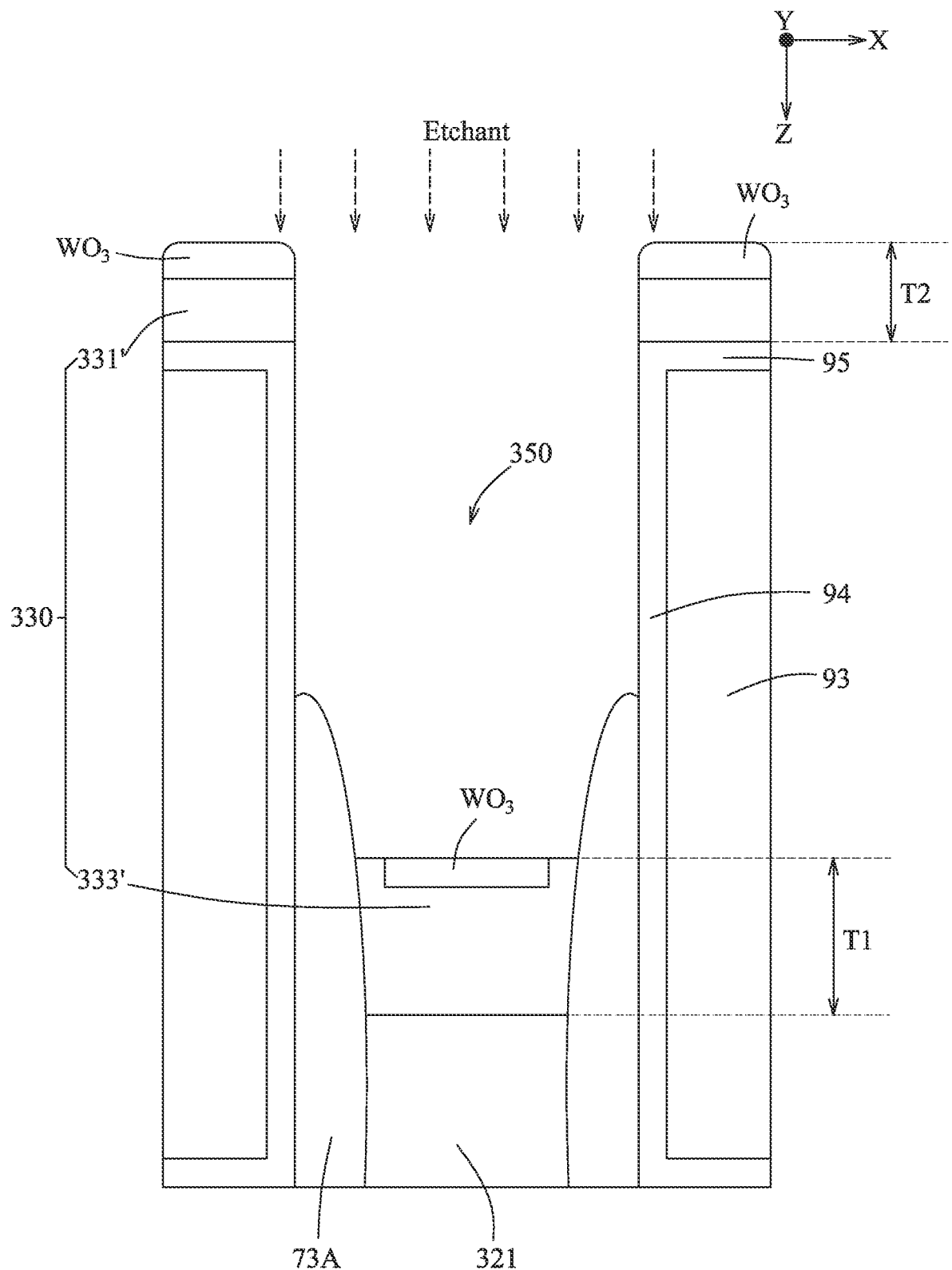

Referring to FIG. 1B and the examples illustrated in FIGS. 21 and 22A, the method proceeds to step 121, where the tungsten-including layer 330 is partially removed using an etchant which has a higher etching selectivity to tungsten than tungsten oxide. As such, the second portion 332 of the tungsten-including layer 330, i.e., the tungsten-including layer 330 at the sidewall of the trench 350, is fully removed, and each of the first and third portions 333, 331 of the tungsten-including layer 330 having the tungsten oxide in the surface region, is at least partially retained. FIG. 22B is a view similar to that of FIG. 21, but showing the structure after completing step 121. In some embodiments, the remaining first portion is denoted by the numeral 333', and may have a thickness (T1) ranging from about 3 nm to about 10 nm along the Z direction. In some embodiments, the remaining third portion is denoted by the numeral 331', and may have a thickness (T2) ranging from about 3 nm to about 10 nm along the Z direction.

In some embodiments, the tungsten-including layer 330 is partially removed using a wet etching process. The etchant used may include ozonated water, which has an ozone concentration ranging from about 5 ppm to about 100 ppm. In some embodiments, the ozone concentration ranges from about 30 ppm to about 50 ppm. In some embodiments, the wet etching process is performed at a temperature ranging from about 10° C. to about 30° C., such as a substantially room temperature. A temperature exceeding such range would be too high, and is unfavorable for maintaining stability of the ozonated water.

The etchant has a higher etching selectivity to tungsten than tungsten oxide and the other features of the structure shown in FIG. 22A (e.g., the CESLs 94), so that the first and third portions 333, 331 and the other features of the structure are not substantially removed during removal of the second portion 332 of tungsten-including layer 330.

Figure 23:
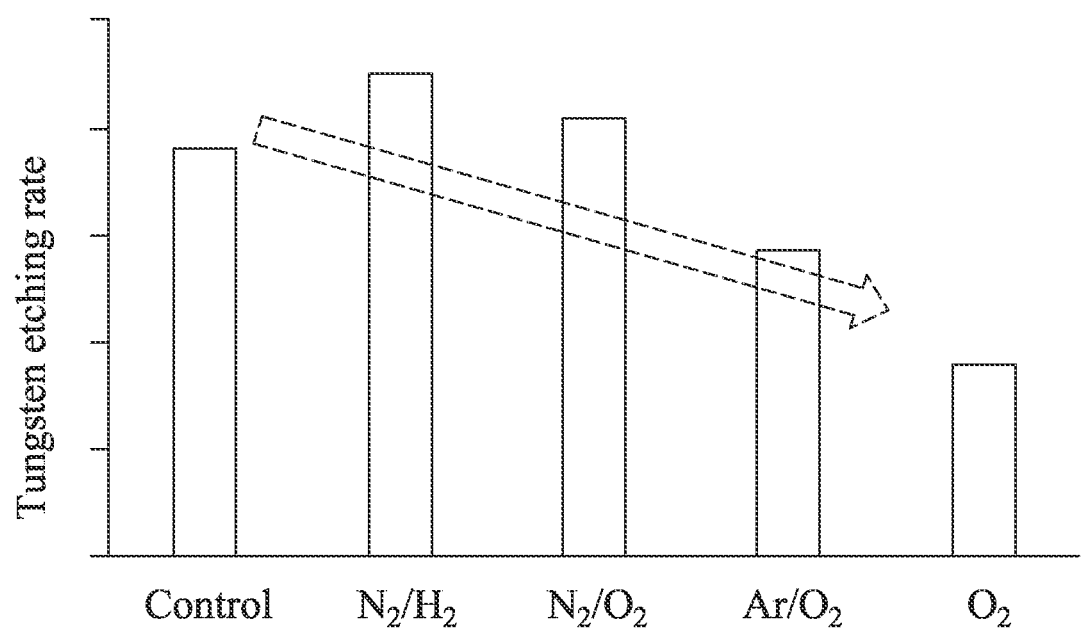
FIG. 23 is a bar chart showing tungsten etching rates of different samples that receive different plasma treatments in accordance with some embodiments of the present disclosure.

An analysis is conducted to justify the effect of the directional treatment of $O_2$ plasma on etching process performed on the tungsten-including layer 330. A control sample (i.e., tungsten without any directional treatment) is subjected to a wet etching process using ozonated water, as described in step 121, and the tungsten etching rate thereof is examined. Other tungsten samples that are respectively treated with $N_2/H_2$, $N_2/O_2$, $Ar/O_2$, and $O_2$ are also subjected to the same wet etching process using ozonated water, and the tungsten etching rates thereof are also examined. The results are shown in FIG. 23. Tungsten samples that are respectively treated with $Ar/O_2$ and $O_2$ show reduced tungsten etching rate compared with that of the control sample. To be specific, the tungsten sample treated with $O_2$ shows the most significant reduction in tungsten etching rate, which is substantially half of the tungsten etching rate of the untreated control sample. This result indicates that the etchant (ozonated water) exerts a much higher (substantially, two times higher) etching selectivity on the untreated tungsten over the tungsten treated with $O_2$ plasma. Meanwhile, tungsten samples respectively treated with $N_2/H_2$, $N_2/O_2$ show increased tungsten etching rates relative to the tungsten etching rate of the control sample, indicating that the etchant has a higher etching selectivity to tungsten treated with $N_2/H_2$, $N_2/O_2$ than the untreated tungsten.

In view of the above results, considering that step 121 aims to mainly remove the tungsten disposed on the trench sidewall, by virtue of intentionally treating the first and third portions 333, 331 of the tungsten-including layer 330 with $O_2$ plasma but not the second portion 332 in step 120, the etching process performed using ozonated water as the etchant in step 121 may effectively remove the second portion 332 that is untreated (tungsten), while the first and third portions 333, 331 that are treated (tungsten oxide) are less affected by the etchant, and thus could be retained as much as possible.

It is noted that incomplete removal of the second portion 332 of the tungsten-including layer 330 might undesirably affect subsequent steps. For instance, in some cases, when the second portion 332 (i.e., the tungsten-including layer 330 formed on sidewall of the trenches 350), is not completely removed, there might be a higher risk of electrical leakage during, e.g., formation of a via (not shown, which is in contact with one of the etched gate structures 32' and which may be referred to as "VG"), or short circuit between a source/drain contact 301 (shown in FIG. 28, which may be referred to as "MD") and an adjacent one of the etched gate structures 32' (which may be referred to as "MG").

In some embodiments, wet etching performed using ozonated water may retain a sufficient thickness of the third portion 333. Since wet etching is an isotropic process, i.e., wet etching is performed in multiple directions, in order to achieve complete removal of the second portion 332 (the tungsten-including layer 330 located on sidewall of the trench being entirely removed) and to retain at least a portion of each of the first and second portions 331, 333, it is important that in step 119, the second portion 332 is formed with a thickness that is less than that of the first and third portions 331, 333 (see FIG. 20B). Other suitable processes for partial removal of the tungsten-including layer 330 are within the contemplated scope of the present disclosure.

Figure 24A:
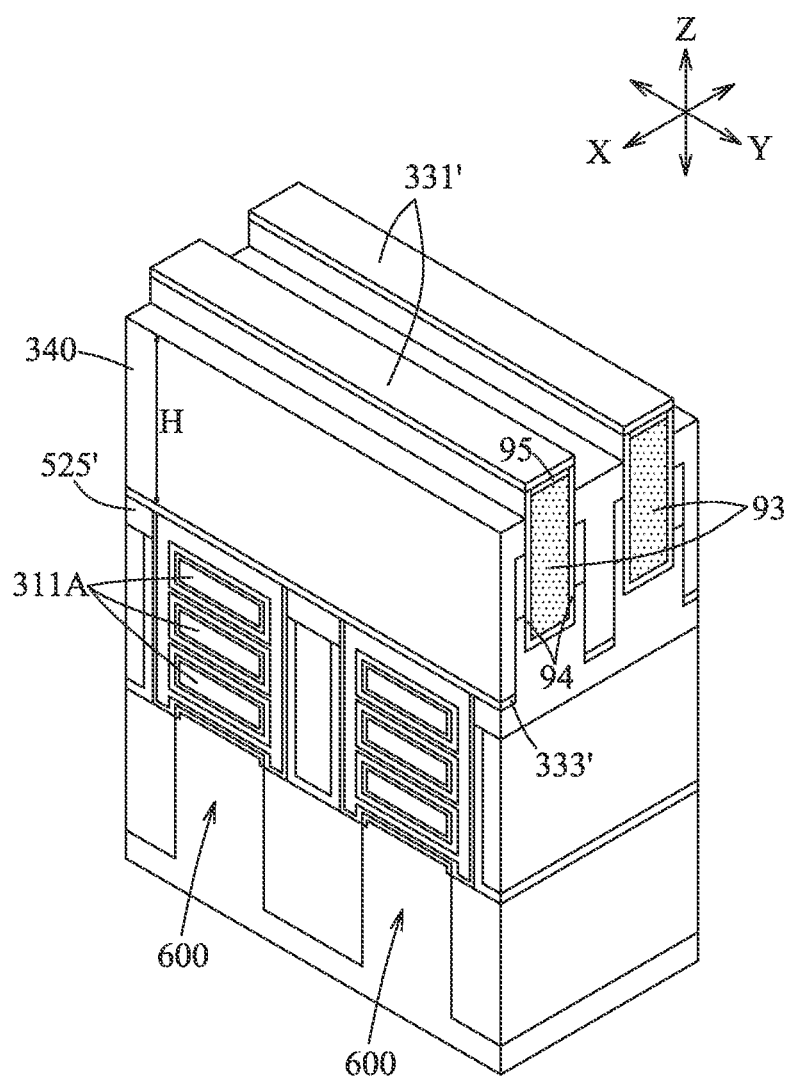
Figure 24B:
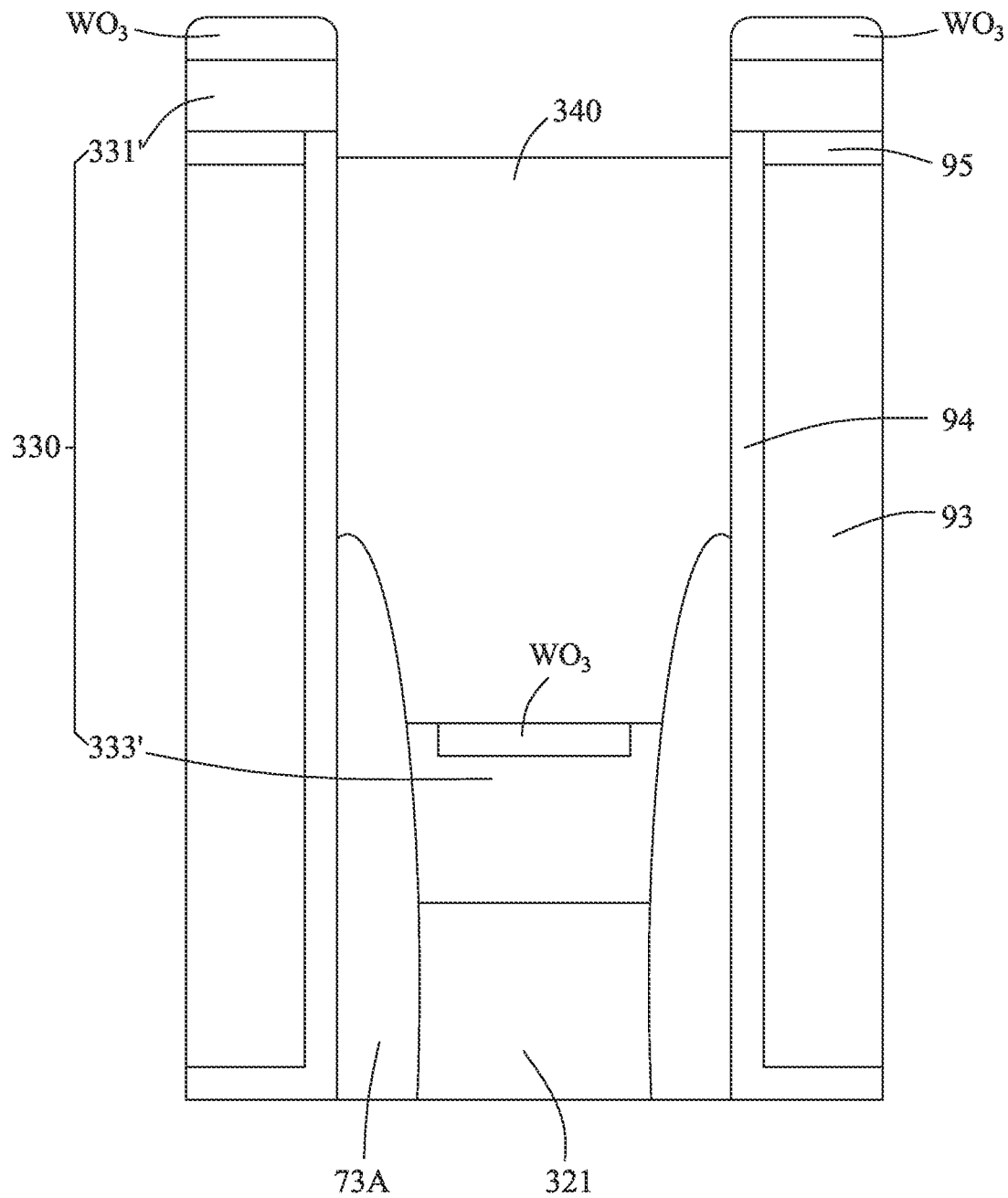

Referring to FIG. 1B and the examples illustrated in FIGS. 22A, 22B and 24A, the method proceeds to step 122, where a bottom anti-reflective coating (BARC) layer 340 is formed in the trench 350 to cover the first portion 333' of the tungsten-including layer 330. FIG. 24B is a view similar to that of FIG. 22B, but illustrating the structure after completing step 122.

In some embodiments, the BARC layer 340 is a layer of porous polymer made from styrene monomers and epoxy crosslinkers. Other suitable materials for forming the BARC layer 340 are within the contemplated scope of the present disclosure.

The BARC layer 340 is formed to protect the first portion 333' from damage during, for instance, an etching process to be subsequently performed in step 123, and to expose the third portion 331'. In some embodiments, the BARC layer 340 may have a height (H) which is greater than 25 nm, and has an upper surface located lower than an upper surface of each of the two adjacent ones of the dielectric portions (each including one of the masking layers 95 and two corresponding ones of the CESLs 94 at the two opposite sides of the one of the masking layers 95), so as to provide sufficient protection to the first portion 333'.

Figure 25A:
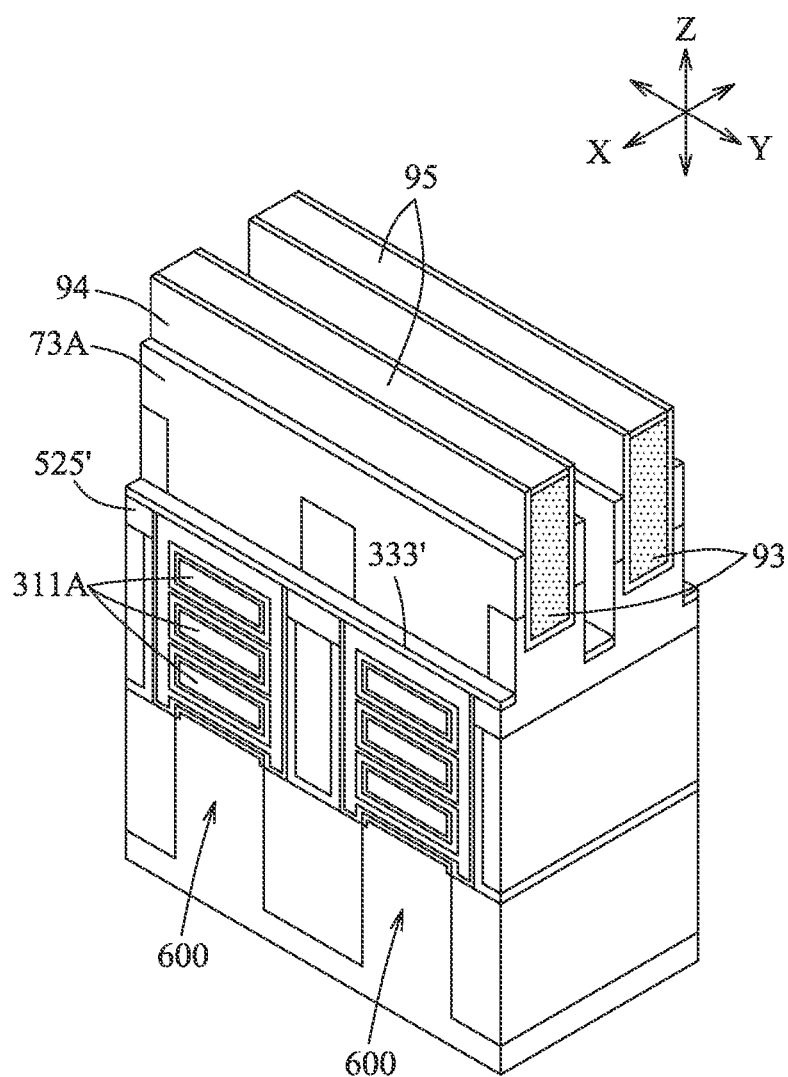
Figure 25B:
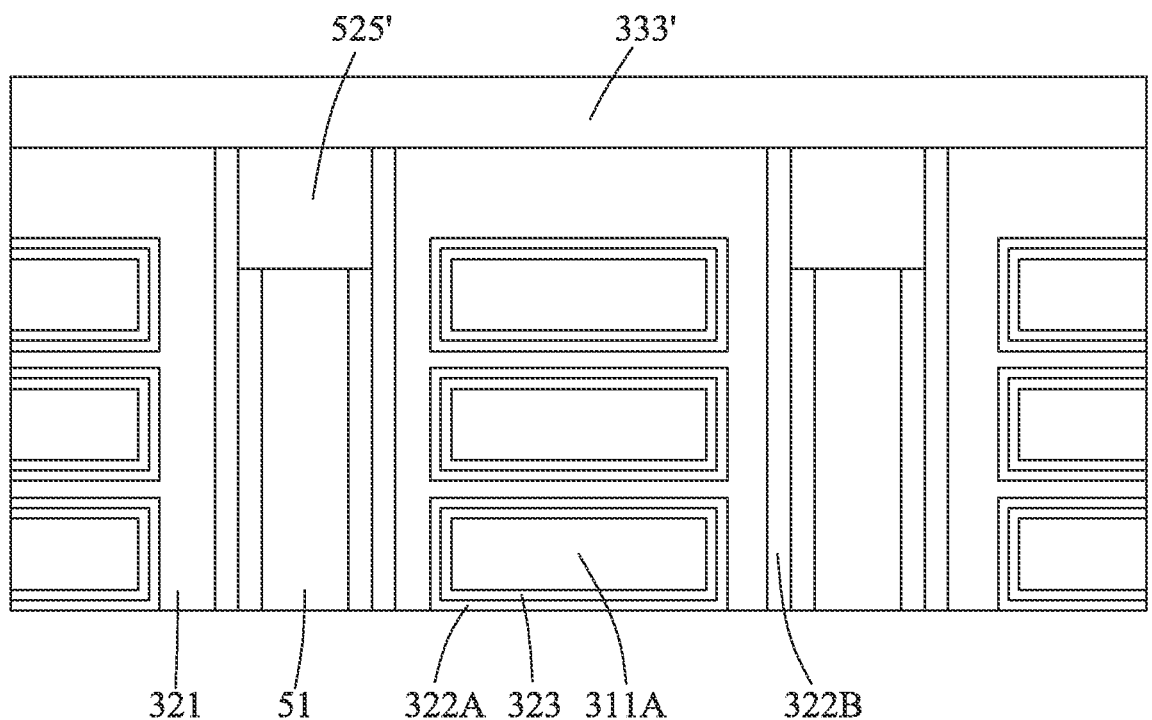
Figure 25C:
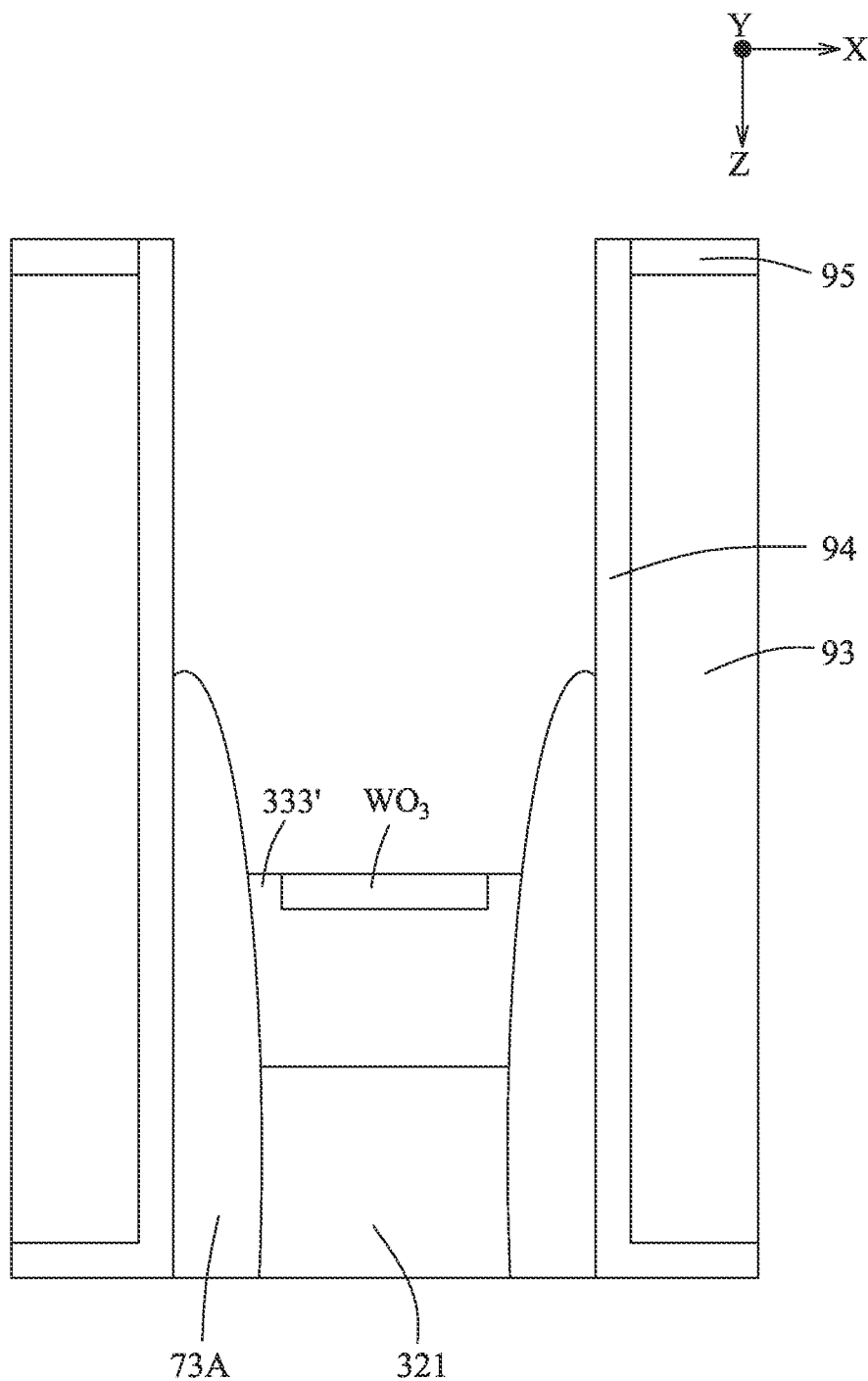

Referring to FIG. 1B and the examples illustrated in FIGS. 24A and 25A, the method proceeds to step 123, where the third portion 333' of the tungsten-including layer 330 is removed. FIG. 25B is a view similar to that of FIG. 19B, but illustrating the structure after completing step 123. FIG. 25C is a view similar to that of FIG. 24B, but illustrating the structure after completing step 123.

In some embodiments, the third portion 331' that is exposed from the BARC layer 340 is removed by, for instance, any suitable etching process, for example, but not limited to, dry etching, wet etching, reactive ion etching (RIE), or the like, or combinations thereof. In some embodiments, step 123 may be performed using a wet etching process that is similar to that described in step 121, and the details are omitted for the sake of brevity. In some other embodiments, the etching process implements an etchant that has a higher etching selectivity to a tungsten-including material than other materials (e.g., the CESLs 94) so that the other materials are not or are not substantially removed during step 123. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve removal of the third portion 331'. Other suitable processes for removing the third portion 331' are within the contemplated scope of the present disclosure. In addition, after removing the third portion 331', the BARC layer 340 is also removed by any suitable process.

By completing step 118 to step 123, the first portion 333' of the tungsten-including layer 330 is formed on the gate electrode 321. Such first portion 333' is beneficial to subsequent steps, e.g., by serving as a buffer layer to reduce threshold voltage between each of the etched gate structures 32' and a via (VG) which is in electrical contact with the corresponding one of etched gate structures 32'. During a VG opening process, the surface region (including tungsten oxide) may be etched away to expose a major region (including tungsten) of the first portion 333'.

Figure 26A:
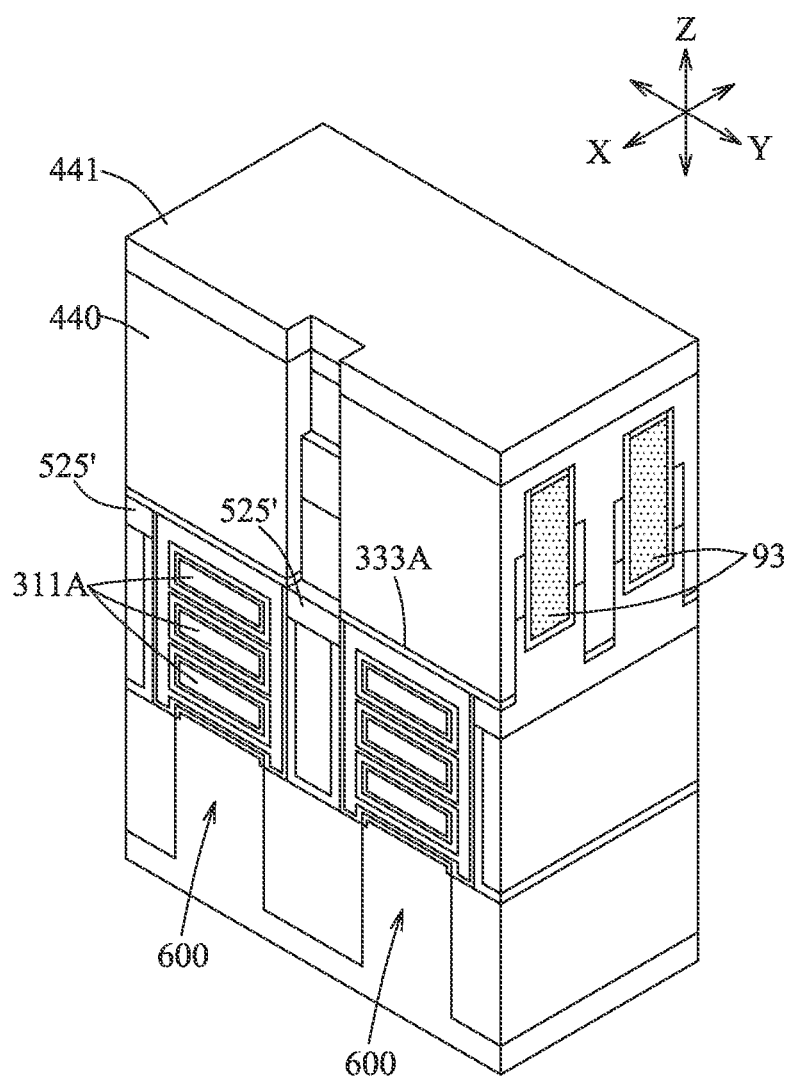
Figure 26B:
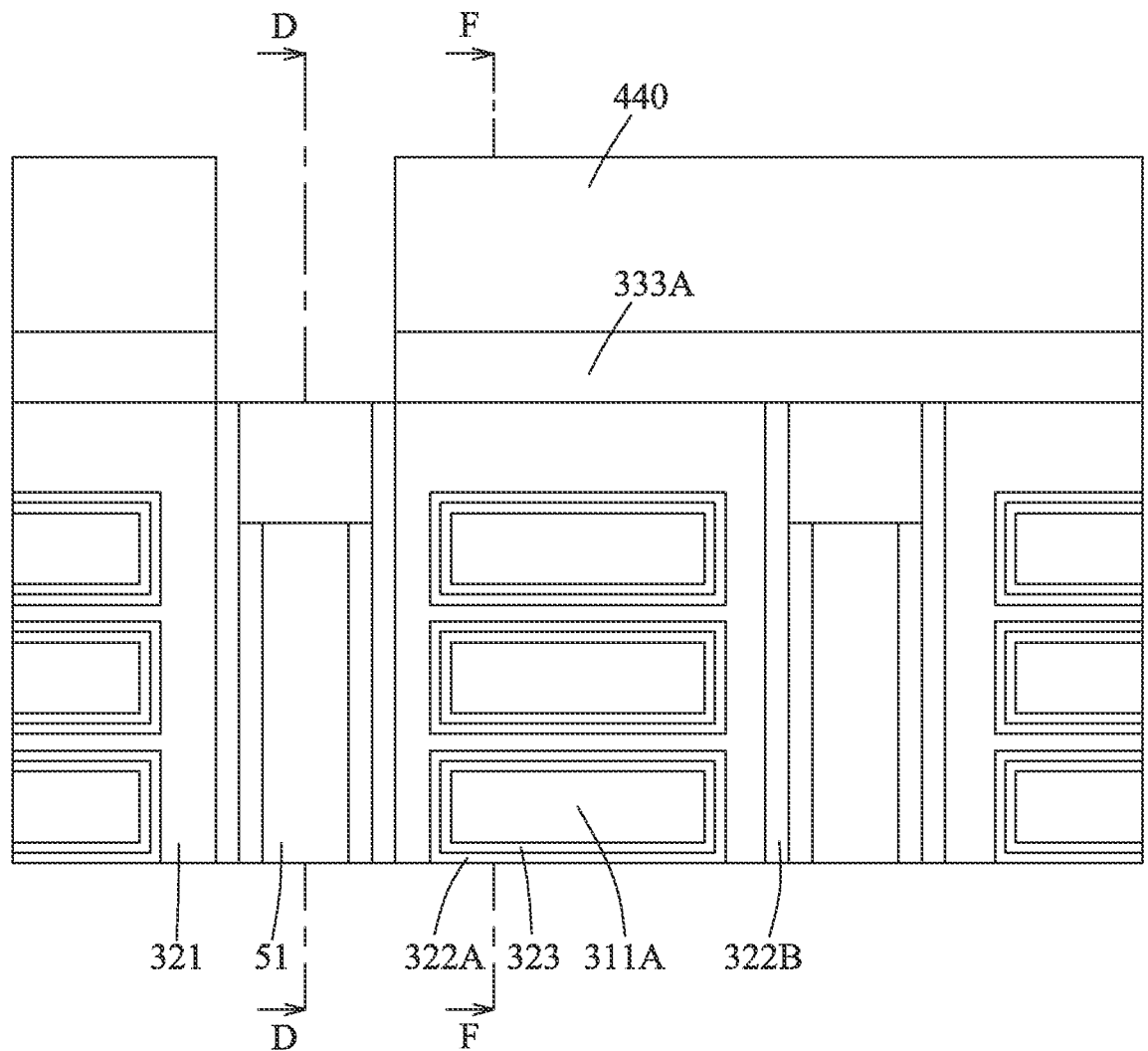
Figure 26C:
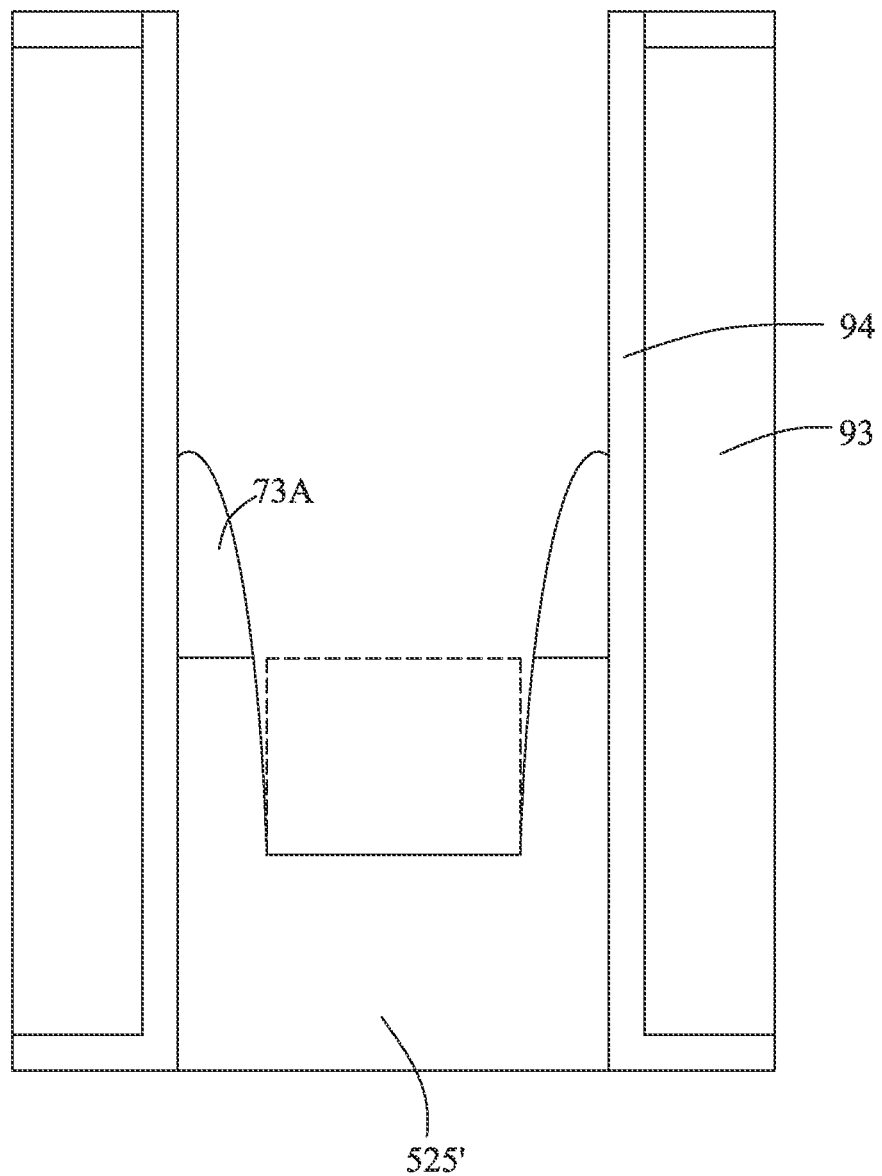
Figure 26D:
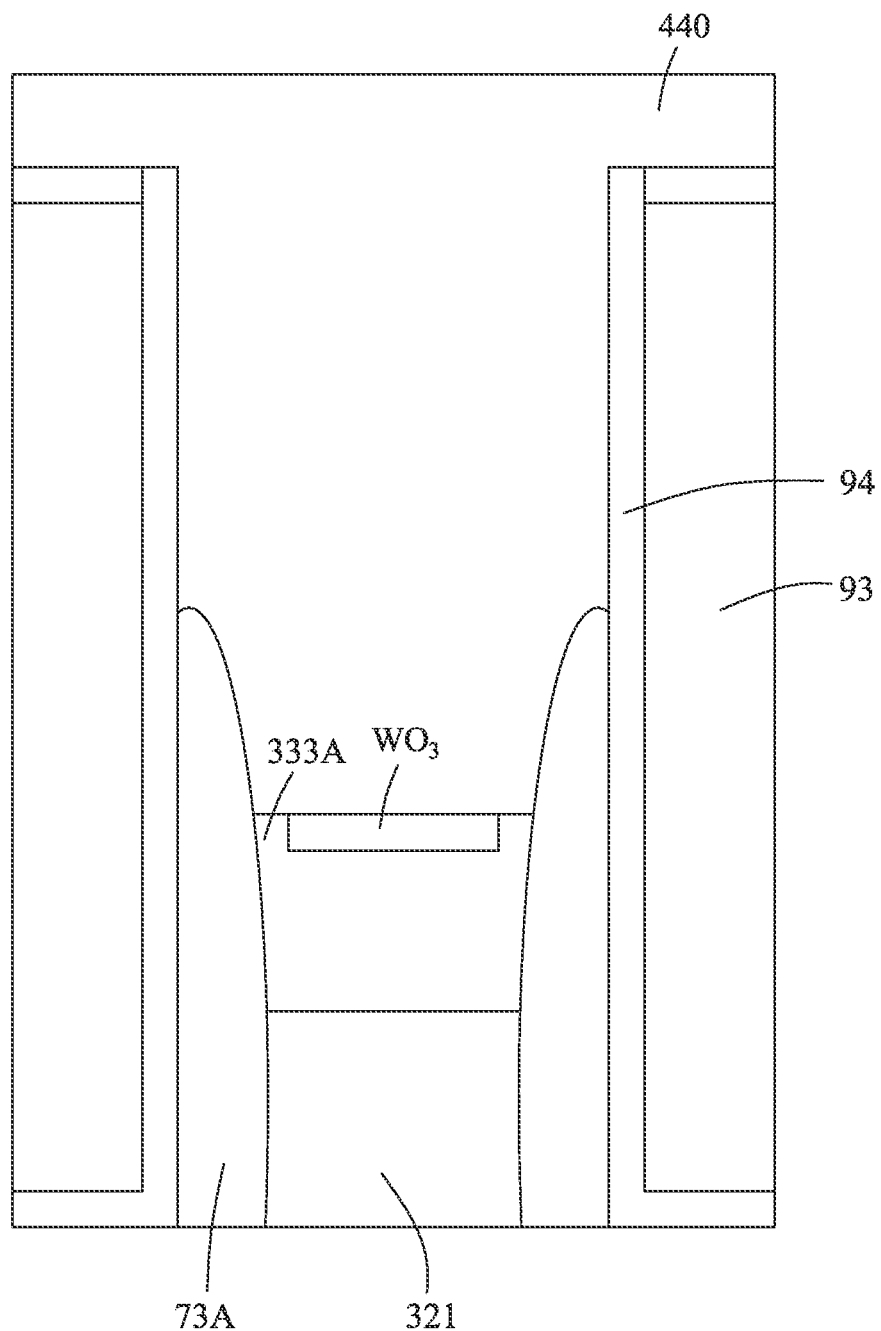

Referring to FIG. 1B and the examples illustrated in FIGS. 25A and 26A, the method proceeds to step 124, where a patterned structure is formed on the first portion 333', followed by patterning of the first portion 333' according to the design of the device. In FIG. 26A, the patterned first portion is denoted by numeral 333A. FIG. 26B is a view similar to that of FIG. 25B, but illustrating the structure after step 124. FIG. 26C is an enlarged cross-sectional view taken along line D-D of FIG. 26B. FIG. 26D is an enlarged cross-sectional view taken along line F-F of FIG. 26B.

In some embodiments, the patterned structure includes a BARC layer 440, and a hard mask layer 441, and may be obtained by (i) depositing a BARC material (not shown, for forming the BARC layer 440) over the structure shown in FIG. 25A, (ii) depositing a hard mask material (not shown, for forming the hard mask layer 441) over the BARC material, (iii) forming a patterned photoresist layer (not shown) on the hard mask material to expose the hard mask material on a predetermined one of the etched isolation elements 525', (iv) partially removing the BARC material and the hard mask material exposed from the patterned photoresist layer so that the BARC material is patterned into the BARC layer 440 and the hard mask material is patterned into the hard mask layer 441, and (v) removing the patterned photoresist layer. In some embodiments, the BARC layer 440 may include materials similar to that of the BARC layer 340 described in step 122. In some embodiments, the hard mask layer 441 may include aluminum oxide. The BARC layer 440, the hard mask layer 441 and the patterned photoresist layer may be independently formed by any suitable process. Other suitable materials and processes for forming the BARC layer 440 and/or the hard mask layer 441 are within the contemplated scope of the present disclosure.

In some embodiments, step 124 includes the sub-steps of (i) forming the patterned structure, and (ii) removing a part of the first portion 333' of the tungsten-including layer 330 exposed from the patterned structure, so that the first portion 333' is patterned. In FIG. 26C, the removed part of the first portion 333' is represented by dotted lines. After completing step 124, the patterned structure may be removed by any suitable process.

Figure 27:
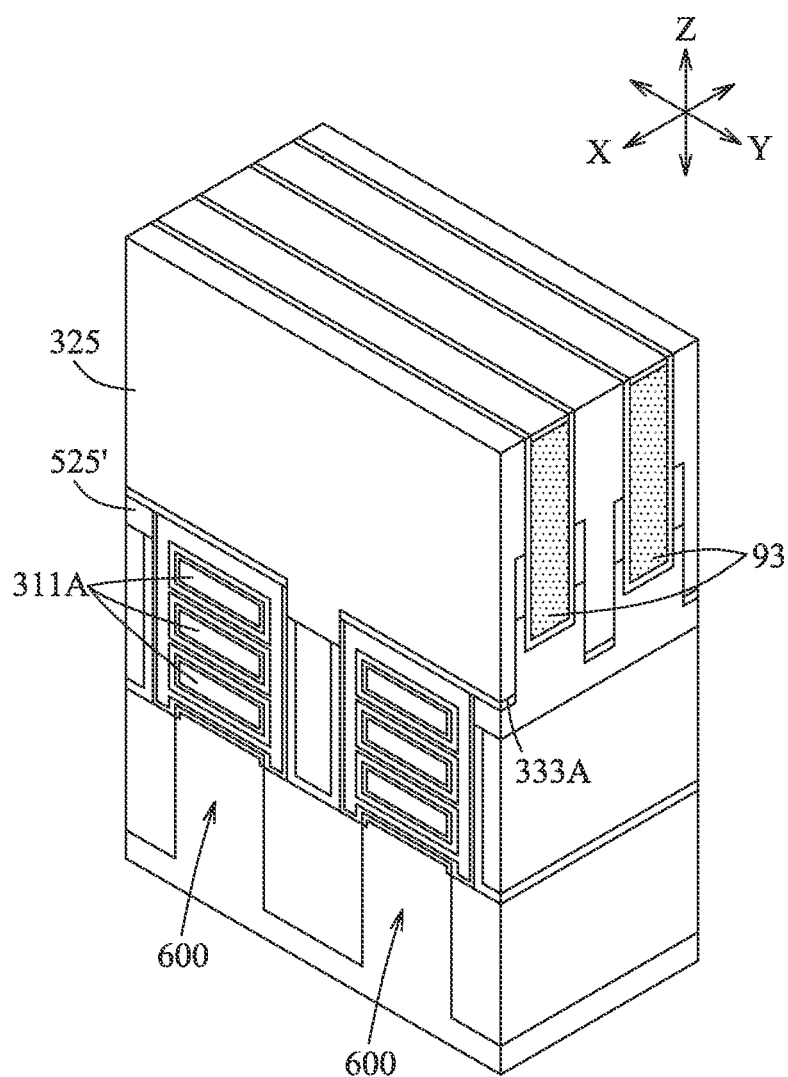

Referring to FIG. 1B and the example illustrated in FIG. 27, the method proceeds to step 125, where a self-aligned contact (SAC) 325 is formed on the patterned first portion 333A.

The SAC 325 may be formed using a deposition process such as, for example, but not limited to, ALD, CVD, PVD, plating, or the like, or combinations thereof. After forming the SAC 325, a planarization process, such as CMP, or the like, may be performed to remove an excess of the SAC 325. Other processes suitable for forming the SAC 325 are within the contemplated scope of the present disclosure.

The SAC 325 may include a low-k dielectric material with a dielectric constant (k) of not greater than about 7, for example, but not limited to, silicon oxide (e.g., $SiO_2$), silicon nitride, silicon carbide, boron nitride, boron carbide, or the like, or combinations thereof. In some embodiments, the low-k dielectric material in the SAC 325 may have a dielectric constant (k) of not greater than about 5. Other materials suitable for the SAC 325 are within the contemplated scope of the present disclosure.

Figure 28:
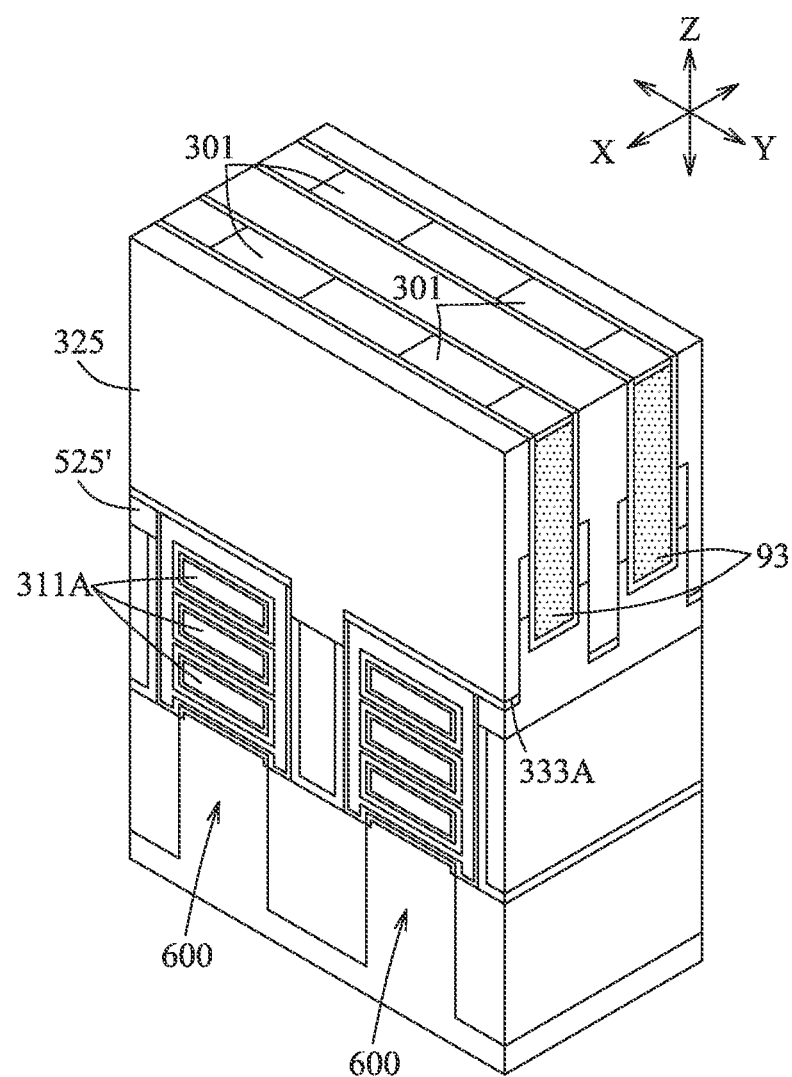

Referring to FIG. 1B and the example illustrated in FIG. 28, the method proceeds to step 126, where source/drain contacts 301 are formed to contact with the source/drain portions 30, respectively. After step 126, the device is obtained.

The source/drain contacts 301 may be formed using an etching process and/or a lithography process. In some embodiments, a patterned mask layer is formed on the structures shown in FIG. 27 using a lithography process. The patterned mask layer is used in the etching process for forming source/drain contact openings, each of which extends through a corresponding one of the masking layers 95, a corresponding one of the ILD layers 93, and a corresponding one of the CESLs 94 to expose a corresponding one of the source/drain portions 30. The etching process may be, for example, but not limited to, a dry etching process, a wet etching process, or the like. To form the source/drain contacts 301, a conductive material is filled in the source/drain contact openings, followed by removing an excess of the conductive material. The conductive material may be, for example, but not limited to, copper, tungsten, cobalt, ruthenium, aluminum, palladium, nickel, platinum, a low resistivity metal constituent, or the like, or combinations thereof. The conductive material may be filled in the source/drain contact openings using a deposition process, such as, for example, but not limited to, ALD, CVD, PVD, plating, or the like. Removal of the excess of the conductive material may be, for example, but not limited to, a planarization process, such as CMP, or the like. The planarization process is performed to expose the masking layers 95.

It should be noted that some steps in the method may be modified, replaced, or eliminated without departure from the spirit and scope of the present disclosure, and those steps may not be in the order mentioned above. In alternative embodiments, other suitable methods may also be applied for forming the device.

In some alternative embodiments, the device may further include additional features, and/or some features present in the device may be modified, replaced, or eliminated without departure from the spirit and scope of the present disclosure.

The embodiments of the present disclosure have the following advantageous features. By selectively treating a portion of a tungsten-including layer with $O_2$ plasma, tungsten at a surface region of the treated portion is converted to tungsten oxide. When the tungsten-including layer is subjected to a wet etching process using, for example, ozonated water as an etchant which shows an etching selectivity that is significantly higher on the untreated portion of the tungsten-including layer than the etching selectivity on the treated portion. Such etching selectivity may be beneficial in the case of the tungsten-including layer being formed in a trench, in which a sidewall portion of the tungsten-including layer is to be removed and a bottom portion of the tungsten-including layer is to be retained. By treating the bottom portion with a directional $O_2$ plasma, tungsten at the bottom portion is converted to tungsten oxide, the untreated sidewall portion (remained as tungsten) may be completely removed by the etchant, while the treated bottom portion (converted to tungsten oxide) may at least be partially retained.

In accordance with some embodiments of the present disclosure, a method for selectively removing a tungsten-including layer includes: forming a tungsten-including layer which has a first portion and a second portion; performing a treatment on a surface region of the first portion of the tungsten-including layer so as to convert tungsten in the surface region into tungsten oxide; and partially removing the tungsten-including layer using an etchant which has a higher etching selectivity to tungsten than tungsten oxide such that the second portion of the tungsten-including layer is fully removed, and the first portion of the tungsten-including layer, having the tungsten oxide in the surface region, is at least partially retained.

In accordance with some embodiments of the present disclosure, the treatment is performed using a directional plasma.

In accordance with some embodiments of the present disclosure, the treatment is performed using $O_2$ plasma.

In accordance with some embodiments of the present disclosure, a power for generating the $O_2$ plasma ranges from 10 W to 100 W.

In accordance with some embodiments of the present disclosure, partially removing the tungsten-including layer is performed using a wet etching process.

In accordance with some embodiments of the present disclosure, the etchant includes ozonated water.

In accordance with some embodiments of the present disclosure, the ozonated water has an ozone concentration ranging from 5 ppm to 100 ppm.

In accordance with some embodiments of the present disclosure, a method for manufacturing a device includes: forming a tungsten-including layer in a trench of a dielectric layer such that the tungsten-including layer has a first portion on a trench bottom of the trench, a second portion on a trench sidewall of the trench, and a third portion on an upper surface of the dielectric layer; performing a directional treatment so as to convert tungsten in a surface region of each of the first and third portions of the tungsten-including layer into tungsten oxide; and partially removing the tungsten-including layer using an etchant which has a higher etching selectivity to tungsten than tungsten oxide such that the second portion of the tungsten-including layer is fully removed, and each of the first and third portions of the tungsten-including layer, having the tungsten oxide in the surface region, is at least partially retained.

In accordance with some embodiments of the present disclosure, the directional treatment is performed using a directional $O_2$ plasma.

In accordance with some embodiments of the present disclosure, partially removing the tungsten-including layer is performed using a wet etching process.

In accordance with some embodiments of the present disclosure, the etchant includes ozonated water.

In accordance with some embodiments of the present disclosure, the ozonated water has an ozone concentration ranging from 5 ppm to 100 ppm.

In accordance with some embodiments of the present disclosure, after partially removing the tungsten-including layer, further comprising: forming a bottom anti-reflective coating (BARC) layer in the trench to cover the first portion of the tungsten-including layer; removing the third portion of the tungsten-including layer, which is exposed from the BARC layer; and removing the BARC layer.

In accordance with some embodiments of the present disclosure, a method for manufacturing a device includes: forming a gate structure between two adjacent ones of source/drain portions such that the gate structure surrounds each of nanosheet segments, the nanosheet segments being spaced apart from each other, each of the nanosheet segments being disposed to interconnect the two adjacent ones of the source/drain portions; etching back the gate structure to form a trench on the etched gate structure and between two adjacent ones of dielectric portions which are located respectively on the two adjacent ones of source/drain portions; forming a tungsten-including layer over the etched gate structure such that the tungsten-including layer has a first portion on the etched gate structure, a second portion on a trench sidewall of the trench, and a third portion on an upper surface of each of the two adjacent ones of the dielectric portions; performing a directional treatment so as to convert tungsten in a surface region of each of the first and third portions of the tungsten-including layer into tungsten oxide; and partially removing the tungsten-including layer using an etchant which has a higher etching selectivity to tungsten than tungsten oxide such that the second portion of the tungsten-including layer is fully removed, and each of the first and third portions of the tungsten-including layer, having the tungsten oxide in the surface region, is at least partially retained.

In accordance with some embodiments of the present disclosure, the directional treatment is performed using a directional $O_2$ plasma.

In accordance with some embodiments of the present disclosure, partially removing the tungsten-including layer is performed using a wet etching process.

In accordance with some embodiments of the present disclosure, the etchant includes ozonated water which has an ozone concentration ranging from 5 ppm to 100 ppm.

In accordance with some embodiments of the present disclosure, the etched gate structure includes a gate electrode and a gate dielectric that has a plurality of first dielectric regions each of which is disposed to separate the gate electrode from a corresponding one of the nanosheet segments, and a second dielectric region which is disposed to separate the gate electrode from the two adjacent ones of the source/drain portions.

In accordance with some embodiments of the present disclosure, the method further includes: forming a bottom anti-reflective coating (BARC) layer in the trench to cover the first portion of the tungsten-including layer; removing the third portion of the tungsten-including layer, which is exposed from the BARC layer; and removing the BARC layer.

In accordance with some embodiments of the present disclosure, the BARC layer has a height which is greater than 25 nm, and an upper surface located lower than an upper surface of each of the two adjacent ones of the dielectric portions.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for selectively removing a tungsten-including layer, comprising:
    forming a tungsten-including layer which has a first portion and a second portion;
    performing a treatment on a surface region of the first portion of the tungsten-including layer so as to convert tungsten in the surface region into tungsten oxide; and
    partially removing the tungsten-including layer using an etchant which has a higher etching selectivity to tungsten than tungsten oxide such that the second portion of the tungsten-including layer is fully removed, and the first portion of the tungsten-including layer, having the tungsten oxide in the surface region, is at least partially retained,
    wherein the second portion is prevented from being treated during performing the treatment on the surface region of the first portion of the tungsten-including layer, and
    wherein partially removing the tungsten-including layer is performed after performing the treatment on the surface region of the first portion of the tungsten-including layer.

2. The method according to claim 1, wherein the treatment is performed using a directional plasma.

3. The method according to claim 1, wherein the treatment is performed using $O_2$ plasma.

4. The method according to claim 3, wherein a power for generating the $O_2$ plasma ranges from 10 W to 100 W.

5. The method according to claim 1, wherein partially removing the tungsten-including layer is performed using a wet etching process.

6. The method according to claim 1, wherein the etchant includes ozonated water.

7. The method according to claim 6, wherein the ozonated water has an ozone concentration ranging from 5 ppm to 100 ppm.

8. A method for manufacturing a device, comprising:
    forming a tungsten-including layer in a trench of a dielectric layer such that the tungsten-including layer has a first portion on a trench bottom of the trench, a second portion on a trench sidewall of the trench, and a third portion on an upper surface of the dielectric layer;
    performing a directional treatment so as to convert tungsten in a surface region of each of the first and third portions of the tungsten-including layer into tungsten oxide; and
    partially removing the tungsten-including layer using an etchant which has a higher etching selectivity to tungsten than tungsten oxide such that the second portion of the tungsten-including layer is fully removed, and each of the first and third portions of the tungsten-including layer, having the tungsten oxide in the surface region, is at least partially retained.

9. The method according to claim 8, wherein the directional treatment is performed using a directional $O_2$ plasma.

10. The method according to claim 8, wherein partially removing the tungsten-including layer is performed using a wet etching process.

11. The method according to claim 8, wherein the etchant includes ozonated water.

12. The method according to claim 11, wherein the ozonated water has an ozone concentration ranging from 5 ppm to 100 ppm.

13. The method according to claim 12, after partially removing the tungsten-including layer, further comprising:
    forming a bottom anti-reflective coating (BARC) layer in the trench to cover the first portion of the tungsten-including layer;
    removing the third portion of the tungsten-including layer, which is exposed from the BARC layer; and
    removing the BARC layer.

14. A method for manufacturing a device, comprising:
    forming a gate structure between two adjacent ones of source/drain portions such that the gate structure surrounds each of nanosheet segments, the nanosheet segments being spaced apart from each other, each of the nanosheet segments being disposed to interconnect the two adjacent ones of the source/drain portions;
    etching back the gate structure to form a trench on the etched gate structure and between two adjacent ones of dielectric portions which are located respectively on the two adjacent ones of source/drain portions;
    forming a tungsten-including layer over the etched gate structure such that the tungsten-including layer has a first portion on the etched gate structure, a second portion on a trench sidewall of the trench, and a third portion on an upper surface of each of the two adjacent ones of the dielectric portions;
    performing a directional treatment so as to convert tungsten in a surface region of each of the first and third portions of the tungsten-including layer into tungsten oxide; and
    partially removing the tungsten-including layer using an etchant which has a higher etching selectivity to tungsten than tungsten oxide such that the second portion of the tungsten-including layer is fully removed, and each of the first and third portions of the tungsten-including layer, having the tungsten oxide in the surface region, is at least partially retained.

15. The method according to claim 14, wherein the directional treatment is performed using a directional $O_2$ plasma.

16. The method according to claim 14, wherein partially removing the tungsten-including layer is performed using a wet etching process.

17. The method according to claim 14, wherein the etchant includes ozonated water which has an ozone concentration ranging from 5 ppm to 100 ppm.

18. The method according to claim 14, wherein the etched gate structure includes a gate electrode and a gate dielectric that has
    a plurality of first dielectric regions each of which is disposed to separate the gate electrode from a corresponding one of the nanosheet segments, and
    a second dielectric region which is disposed to separate the gate electrode from the two adjacent ones of the source/drain portions.

19. The method according to claim 14, further comprising:
forming a bottom anti-reflective coating (BARC) layer in the trench to cover the first portion of the tungsten-including layer;
removing the third portion of the tungsten-including layer, which is exposed from the BARC layer; and
removing the BARC layer.

20. The method according to claim 19, wherein the BARC layer has a height which is greater than 25 nm, and an upper surface located lower than an upper surface of each of the two adjacent ones of the dielectric portions.

* * * * *